US009509330B2

(12) United States Patent
Oshima

(10) Patent No.: US 9,509,330 B2
(45) Date of Patent: Nov. 29, 2016

(54) ANALOG-TO-DIGITAL CONVERTER PROBE FOR MEDICAL DIAGNOSIS AND MEDICAL DIAGNOSIS SYSTEM

(71) Applicant: Hitachi, Ltd., Tokyo (JP)

(72) Inventor: Takashi Oshima, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/727,904

(22) Filed: Jun. 2, 2015

(65) Prior Publication Data

US 2016/0105193 A1    Apr. 14, 2016

(30) Foreign Application Priority Data

Apr. 3, 2014   (JP) .................................. 2014-077222

(51) Int. Cl.
*H03M 1/34* (2006.01)
*H03M 1/40* (2006.01)

(52) U.S. Cl.
CPC .................................. *H03M 1/403* (2013.01)

(58) Field of Classification Search
CPC ............. H03M 1/1002; H03M 1/186; H03M 1/0854; H03M 1/1255
USPC ................. 341/163, 122, 110, 155, 144, 172
See application file for complete search history.

(56) References Cited

U.S. PATENT DOCUMENTS

2009/0289821 A1\* 11/2009 Li ........................ H03M 1/1205
341/110
2012/0075128 A1\* 3/2012 Aruga ................. H03M 1/1019
341/110
2012/0268302 A1\* 10/2012 Etou .................... H03M 1/0604
341/161
2015/0137854 A1\* 5/2015 Li ......................... H03M 1/167
327/93

OTHER PUBLICATIONS

Kim, M. G. et al., "A 10 MS/s 11-bit 0.19 mm² Algorithmic ADC With Improved Clocking Scheme", IEEE Journal of Solid-State Circuits, Sep. 2009, p. 2348-2355, vol. 44, No. 9.
Ahmed, I. et al., "A 50MS/s 9.9mW Pipelined ADC with 58dB SNDR in 0.18 μm CMOS Using Capacitive Charge-Pumps", IEEE International Solid-State Circuits Conference, 2009, p. 164-166.

\* cited by examiner

*Primary Examiner* — Peguy Jean Pierre
(74) *Attorney, Agent, or Firm* — Mattingly & Malur, PC

(57) ABSTRACT

Provided is an analog-to-digital converter capable of suppressing an increase in an occupation area. The analog-to-digital converter includes a multiplying digital-to-analog conversion circuit which includes a capacitance circuit that samples and amplifies an input signal, a quantizer that quantizes the input signal, and a control circuit that determines a voltage to be supplied to the capacitance circuit in accordance with an output from the quantizer. The capacitance circuit includes a first capacitance element and a second capacitance element, each of which includes a first electrode to which a normal phase signal corresponding to the input signal is supplied and a second electrode to which an opposite phase signal is supplied when the input signal is sampled. When the input signal is amplified, an output from the control circuit is supplied to the respective second electrodes, and signals from the respective first electrodes are regarded as amplified residual error amplified signal.

18 Claims, 15 Drawing Sheets

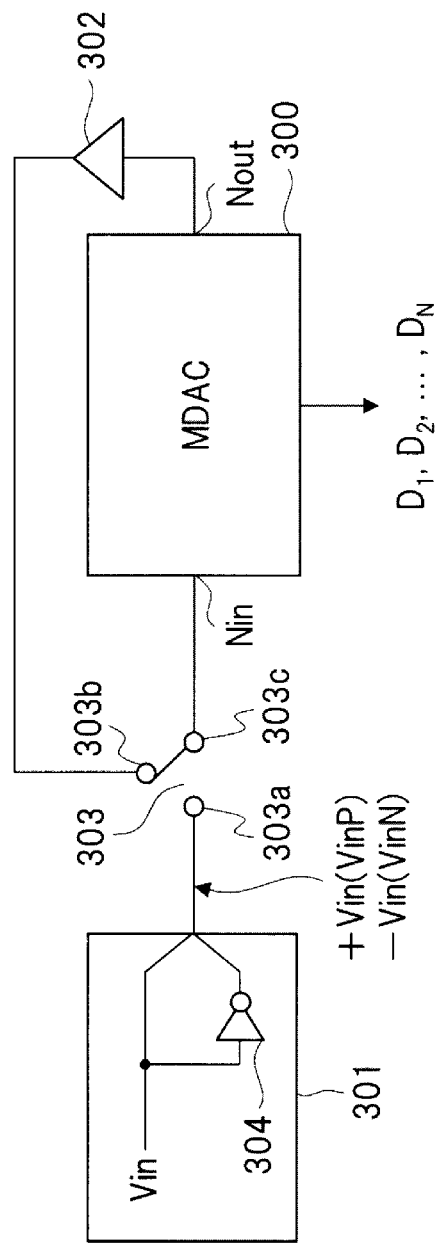
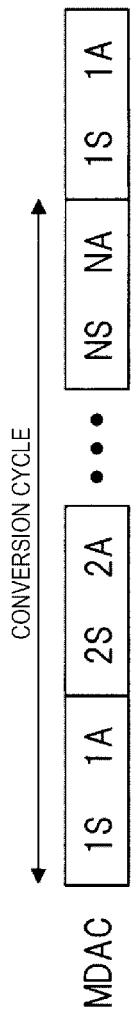
FIG. 3A
FIG. 3B

600

ANALOG-TO-DIGITAL CONVERTER PROBE FOR MEDICAL DIAGNOSIS AND MEDICAL DIAGNOSIS SYSTEM

CROSS-REFERENCE TO RELATED APPLICATION

This is application claims the priority of Japanese Patent Application No. 2014-077222 Filed Apr. 3, 2014, which is incorporated herein by reference in its entirety.

BACKGROUND OF THE INVENTION

Field of the Invention

The present invention relates to an analog-to-digital converter, and particularly to a cyclic-type analog-to-digital converter that is useful when used in a probe for medical diagnosis and a medical diagnosis system provided with a probe for medical diagnosis.

Background Art

As diagnosis apparatuses that configure a medical diagnosis system, an ultrasonic diagnosis apparatus and an X-ray CT scanner apparatus are exemplified, for example. Many of these diagnosis apparatuses are used with a probe for medical diagnosis (including a movable-type detection unit in a case of the X-ray CT scanner or the like) that is made to abut on a human body and configure a medical diagnosis system. In relation to the medical diagnosis system, higher resolution of an image inside the human body has been required for further precise diagnosis. A signal measured by a probe for diagnosis is an analog signal, and processing inside the diagnosis apparatus is performed by using a digital signal. Therefore, the medical diagnosis system is provided with an analog-to-digital converter.

With the requirement for the higher resolution of the image inside the body, the medical diagnosis system is required to include a larger number of analog-to-digital converters with higher performances. For example, the medical diagnosis system is required to include multiple high-performance analog-to-digital converters with high resolution that is as high as ten and several bits or greater at a high conversion rate of several tens of Msps or greater. In a case of providing such high-performance analog-to-digital converters in the probe for medical diagnosis, the high-performance analog-to-digital converters are required to have a significantly small occupation area and significantly low power consumption on whole different scales as compared with those in the related art from the viewpoint of a decrease in the size of the probe for medical diagnosis. That is, as the analog-to-digital converters to be mounted to the probe for medical diagnosis, high-performance analog-to-digital converters that have a small occupation area, low power consumption, and high resolution of ten and several bits or greater at a high conversion rate of several tens of Msps or greater are required.

As an analog-to-digital converter that has a small occupation area, in other words, an analog-to-digital converter that is suitable for installation in a small area, a cyclic-type analog-to-digital converter is known. The cyclic-type analog-to-digital converter is disclosed in M. Kim. P. Hanumolu and U. Moon, "A10 MS/s 11-bit 0.19 mm$^2$ algorithmic ADC with improved clocking scheme", IEEE Journal of Solid-State Circuits, Vol. 44, pp. 2348-2355, September 2009.

Here, a description will be given of a configuration and operations of the cyclic-type analog-to-digital converter. FIGS. 9A to 9D and 10 are diagrams that the present inventors created to review a cyclic-type analog-to-digital converter 900 prior to the present invention.

FIG. 9A is a block diagram illustrating a configuration of the cyclic-type analog-to-digital converter 900 that is configured of a single multiplying digital-to-analog converter circuit (hereinafter, also abbreviated as an MDAC). FIG. 9B is a timing diagram illustrating a conversion operation performed by the MDAC 901 illustrated in FIG. 9A. FIG. 9C is a diagram illustrating a configuration of a cyclic-type analog-to-digital converter 900 that is configured of two MDAC by connecting two MDACs 901a and 901b in series. FIG. 9D is a timing diagram illustrating a conversion operation performed by the two MDACs 901a and 901b illustrated in FIG. 9C. Though not particularly limited, the MDACs 901, 901a, and 901b have the same configuration, and an example of the configuration is illustrated in FIG. 10.

In FIG. 9A, the cyclic-type analog-to-digital converter 900 is provided with the MDAC 901 and a switch 904. First, the switch 904 is arranged on the lower side, and a conductive state is established between a node 904a and a node 904c of the switch 904. In doing so, an input signal 902 as an analog signal is supplied to the MDAC 901. When the switch 904 is arranged on the lower side, the supplied input signal is converted from 4-bit digital signals $D_1$ to $D_4$ in this example. In the 4-bit digital conversion, the MDAC 901 converts each bit of the input signal in a time-series manner from an upper-order bit side ($D_1$, for example) to the lower-order bit side ($D_4$, for example) of the digital signal.

That is, the MDAC 901 samples the supplied input signal, obtains a digital value of 1 bit ($D_1$, for example) corresponding to the sampled voltage value, and outputs the digital value. Then, a residual error (difference) between a voltage corresponding to the obtained digital value of 1 bit ($D_1$, for example) and an input voltage obtained by the sampling is obtained and amplified, and a residual error voltage obtained by the amplification is supplied to the node 904b of the switch 904 via a route 903. The switch 904 is arranged on the upper side so as to establish conduction between the node 904b and the node 904c during a period when the analog-to-digital conversion operation is performed. In doing so, the amplified residual error voltage is input to the MDAC 901 again, and the sampling and the amplification operation are performed. During the sampling, a next bit ($D_2$, for example) is obtained and output. As described above, the analog signal is converted into 4-bit digital signals. Here, each of $D_1$ to $D_4$ is a binary value of ±1 or a ternary value of ±1 and 0.

In FIGS. 9B, 1S, 2S, 3S, and 4S each represent a period (sampling period) during which the sampling is performed by the MDAC 901, and 1A, 2A, 3A, and 4A each represent a period (residual error amplification period) during which the residual error is amplified. Although not particularly limited, the sampling period is substantially the same as the residual error amplification period. Since the analog signal is converted into 4-bit digital signals in this example, one conversion cycle is from the sampling period 1S to the residual error amplification period 4A as illustrated in FIG. 9B. When the analog signal is converted into the digital signal in the time series manner, the conversion cycle is repeated.

FIG. 9C illustrates another configuration of the cyclic-type analog-to-digital converter 900. In the drawing, 901a and 901b each represent an MDAC that has the same configuration as that of the MDAC 901 illustrated in FIG. 9A. However, the MDAC 901a (901b) is different from the MDAC 901 in that the MDAC 901a (901b) converts an input signal into 2-bit digital signals $D_1$ and $D_3$ ($D_2$, $D_4$). In addition, an output of the MDAC 901a is connected to an input of the MDAC 901b via a route 906, and an output of the MDAC 901b is connected to the node 904b of the switch 904 via a route 905. That is, the MDACs 901a and 901b are connected in series and have a two-stage configuration.

The MDAC 901a and the MDAC 901b operate in a mutually overlapping manner. That is, the sampling periods (1S, 3S) of the MDAC 901a overlap the residual error amplification periods (4A, 2A) of the MDAC 901b, and the residual error amplification periods (1A, 3A) of the MDAC 901a overlap the sampling periods (2S, 4S) of the MDAC 901b as illustrated in FIG. 9D. In doing so, it is possible to shorten the conversion cycle of each of the MDACs 901a and 901b into half of the conversion cycle as illustrated in FIG. 9B. In such a case, 2-bit digital signals ($D_1$, $D_3$) are output from the MDAC 901a in the sampling periods 1S and 3S, and 2-bit digital signals ($D_2$, $D_4$) are output from the MDAC 901b in the sampling periods 2S and 4S. As a result, it is possible to shorten the conversion cycle while keeping the same conversion bit number as that of the cyclic-type analog-to-digital converter illustrated in FIG. 9A. That is, it is possible to double the conversion rate. However, since the two MDACs are used, it is considered that an installation area (occupation area) increases.

In order to realize a higher conversion rate in the cyclic-type analog-to-digital converters illustrated in FIGS. 9A and 9C, it is necessary to shorten a time of conversion processing of each bit, which is performed by the MDACs 901, 901a, and 901b.

Next, a description will be given of the multiplying digital-to-analog converter circuit (MDAC) 901 that was reviewed by the present inventors, with reference to FIG. 10.

The MDAC 901 is basically configured of an analog circuit and includes a rough quantizer 1000 that roughly quantizes an input signal Vin, a digital-to-analog conversion unit (DAC) 1001, a differentiator 1002, and an amplification unit 1003. Here, the input signal Vin is a signal that is supplied to the MDAC 901 via the switch 904 in FIG. 9A or 9C. In addition, an output Vout of the amplification unit 1003 is a signal that is supplied to the route 903, 905, or 906 in FIG. 9A or 9C.

The input voltage Vin is roughly quantized by the rough quantizer 1000, and the result thereof corresponds to the digital signal $D_i$ (i-th bit) as an output of the MDAC 900. In addition, the digital signal $D_i$ is converted again into an analog voltage corresponding to the digital signal $D_i$ by the digital-to-analog conversion unit 1001. A difference from the analog voltage obtained after the conversion and the input voltage Vin is obtained by the differentiator 1002. Since the difference corresponds to a voltage obtained by subtracting the voltage corresponding to the digital signal $D_i$ from the input voltage Vin, the difference is regarded as a residual error voltage. The residual error voltage is amplified by the amplification unit 1003 with a gain G, and the output Vout of the MDAC is obtained. The output Vout is used as the next input voltage Vin for the MDAC 901, and conversion processing for obtaining the next bit is performed. By repeating such an operation (MDAC operation) N times, N-bit digital signals $D_1$ to $D_N$ are finally obtained. In the example illustrated in FIG. 9A, the MDAC operation (conversion processing) is executed four times.

At this time, a relationship between the analog voltage Vin as the input signal and the digital signals $D_1$ to $D_N$ is represented by Equation (1). Here, Q is a quantization error that is caused by the rough quantizer 1000, $G_i$ is a gain of the amplification unit 1003 at the i-th (i=1 to N−1) MDAC, and Vref is a reference voltage. In the case in which a plurality of MDACs 901a and 901b are connected in series as illustrated in FIG. 9C, it is assumed that the gain G of the amplification unit 1003 at each of the MDACs varies between the MDACs. Therefore, the gains of the respective MDACs are separately represented in Equation (1). It is a matter of course that in a case in which the cyclic-type analog-to-digital converter 900 is configured of the single MDAC 901 as in FIG. 9A, each of the gains $G_1$ to $G_{N-1}$ in Equation (1) may be the gain G of the amplification unit 1003 of the MDAC 901.

$$Vin = \frac{1}{2}D_1 \cdot Vref + \frac{1}{2G_1}D_2 \cdot Vref + \ldots \frac{1}{2G_1 \cdot G_2 \ldots G_{N-2} \cdot G_{N-1}} \cdot D_N \cdot Vref + \frac{Q}{G_1 \cdot G_2 \ldots G_{N-2} \cdot G_{N-1}} \quad (1)$$

Here, a term from which the last term ($Q/G_1 \cdot G_2 \ldots G_{N-2} \cdot G_{N-1}$) of the Equation (1) corresponds to the analog-to-digital conversion result. That is, the term portion from which the last term is removed represents the relationship between the input voltage Vin and the digital signals $D_1$ to $D_N$. In this case, the last term corresponds to a conversion error. Therefore, according to the cyclic-type analog-to-digital converter, it is possible to reduce the conversion error by increasing the gain G (in other words, the residual error amplification rate) of the amplification unit 1003 that is provided in the MDAC to be greater than one and increasing the number N of times of the conversion.

"A10 MS/s 11-bit 0.19 mm² algorithmic ADC with improved clocking scheme", discloses the cyclic-type analog-to-digital converter using the MDAC. In the MDAC disclosed in "A10 MS/s 11-bit 0.19 mm² algorithmic ADC with improved clocking scheme", the amplification of the residual error is realized by a feedback operation of an operational amplifier. In order to increase the conversion rate of the cyclic-type analog-to-digital converter, it is necessary to shorten the time of the conversion processing of each bit as described above. In order to shorten the time of conversion processing, the use of a wide-band operational amplifier as the operational amplifier is required, and power consumption by the operational amplifier is considered to increase according to "A10 MS/s 11-bit 0.19 mm² algorithmic ADC with improved clocking scheme". That is, in a case of increasing the conversion rate, the power consumption by the cyclic-type analog-to-digital converter is considered to increase.

Imran Ahmed, Jan Mulder, David A, Johns, "A 50 MS/s 9.9 mW Pipelined ADC With 58 dB SNDR in 0.18 um CMOS Using Capacitive Charge-Pumps", 2009 IEEE International Solid-State Circuits Conference, pp. 164-165, February 2009 discloses a pipeline-type analog-to-digital converter. "A 50 MS/s 9.9 mW Pipelined ADC With 58 dB SNDR in 0.18 um CMOS Using Capacitive Charge-Pumps" discloses a technology of realizing residual error amplification without using the operational amplifier. In order to review the technology described therein, the present inventors created a diagram of a circuit as a target of review based on the content disclosed therein. FIG. 11 is an explanatory diagram illustrating a configuration of the circuit as the target of review, which was created by the present inventors. Next, a description will be given of the circuit as the target of review.

The circuit as the target of review that is illustrated in FIG. 11 is provided with capacitance elements C11 and C12, a switch 1101, and a rough quantizer 1100. The operation of the circuit as the target of review can be divided into a sampling period (the left side of the arrow in FIG. 11) and a residual error amplification period (right side of the arrow in FIG. 11) in the same manner as the MDAC 901 illustrated in FIGS. 9A and 9B. That is, the circuit as the target of review operates in the sampling period and then operates in the residual error amplification period. In addition, as input signals Vin, a normal phase input signal +Vin corresponding to the input signal and an opposite phase input signal −Vin with an opposite (inverted) phase with respect to the normal phase input signal Vin are supplied.

In the sampling period, the normal phase input signal +Vin is supplied to one electrode of the capacitance element C11, and the opposite phase input signal −Vin is supplied to the other electrode of the capacitance element C12. In the drawing, the normal phase input signal +Vin and the opposite phase input signal −Vin are depicted as a sine wave and an inverted sine wave in order to expressly illustrate that the normal phase input signal +Vin and the opposite phase input signal −Vin have inverted phases. However, the input signal supplied to one electrode of each of the capacitance elements C11 and C12 in the sampling period is a signal (voltage) at a timing t1 in FIG. 11, for example. At the timing t1, the other electrode of each of the capacitance elements C11 and C12 is connected to an AC ground (ground voltage Vs). That is, a so-called pseudo differential is configured in the sampling period. In doing so, the normal phase input signal +Vin is applied to the AC ground (Vs) between a pair of electrodes of the capacitance element C11, and charging of electric charge is performed in the sampling period. Similarly, the opposite phase input signal −Vin is applied to the AC ground (Vs) between a pair of electrodes of the capacitance element C12, and charging of electric charge is performed.

In addition, the rough quantizer 1100 quantizes the input signal Vin in the sampling period. In FIG. 11, the quantization is performed by dividing a voltage range of the input signal into three stages and determining which of the ranges the voltage of the input signal is present in by the rough quantizer 1100. Here, the digital signal $D_i$ that represents one of 0, +1 and −1 is output from the rough quantizer 1100 depending on the voltage value of the input signal.

Next, in the residual error amplification period, one electrode of the capacitance element C12 is connected to the other electrode of the capacitance element C11, and the other electrode of the capacitance element C12 is connected to the switch 1101. In addition, the output signal Vout is extracted from one electrode of the capacitance element C11. The switch 1101 includes three switches 1102 to 1104, and the three switches 1102 to 1104 are brought into an ON state in accordance with the value of the digital signal $D_i$. In doing so, one of reference voltages Vref, 0 V, and −Vref is applied to the other electrode of the capacitance element C12 in accordance with the value of the digital signal $D_i$.

In the residual error amplification period, the capacitance elements C11 and C12 that are electrically charged in the sampling period are connected in series. Therefore, a voltage value of the output signal Vout for the other electrode of the capacitance element C12 is double that of the input signal Vin in accordance with a principle of conversion of charge. In addition, since a voltage (+Vref, 0 v, −Vref) in accordance with the value of the digital signal $D_i$ is applied to the other electrode of the capacitance element C12, the output signal Vout becomes a value (residual error) that reflects the value of the digital signal $D_i$ after conversion. By performing such a series of operations (the operation in the sampling period and the operation in the residual error amplification period), it is possible to provide the same function as that of the residual error amplification in the MDAC. In a case in which capacitance values of the capacitance elements C11 and C12 are the same capacitance value C, a rate G of residual error amplification is substantially doubled.

According to the circuit as the target of review, it is possible to configure the MDAC without using any operational amplifier. However, it is necessary to provide capacitance elements with capacitance values, a total of which is 2C, and it is considered that the occupation area increases. In addition, since it is necessary to generate three types of reference voltages, namely +Vref, 0 V, and −Vref, it is considered that power consumption increases due to a reference voltage generation circuit that generates these reference voltages and power consumption as a whole increases.

SUMMARY OF THE INVENTION

An object of the present invention is to provide an analog-to-digital converter that is capable of suppressing an increase in an occupation area.

A brief description will be given of outlines of representative inventions disclosed in this application as follows.

That is, an analog-to-digital converter includes at least one multiplying digital-to-analog conversion circuit, and the multiplying digital-to-analog conversion circuit includes a capacitance circuit that samples and amplifies an input signal, a quantizer that quantizes the input signal, and a control circuit that determines a voltage to be supplied to the capacitance circuit in accordance with an output from the quantizer. Here, the capacitance circuit includes a first capacitance element that includes a first electrode to which a normal phase signal corresponding to the input signal is supplied and a second electrode to which an opposite phase signal with an opposite phase to that of the normal phase signal when the input signal is sampled, and a second capacitance element that includes a first electrode to which the normal phase signal is supplied and a second electrode to which the opposite phase signal is supplied. When the input signal is amplified, a voltage in accordance with an output from the quantizer is supplied from the control circuit to the second electrodes of the first capacitance element and the second capacitance element, and signals from the first electrodes of the first capacitance element and the second capacitance element are regarded as amplified signals.

Since a voltage difference between the normal phase signal and the opposite phase signal is applied between the first electrode and the second electrode of each of the first capacitance element and the second capacitance element when the input signal is sampled, it becomes possible to increase the amounts of electrical charge accumulated in the first capacitance element and the second capacitance element with respect to the same capacitance value. In doing so, it is possible to reduce the capacitance values of the first capacitance element and the second capacitance element that are included in the capacitance circuit and to thereby realize a decrease in the size of these capacitance elements and to suppress an increase in an occupation area of the analog-to-digital converter.

In addition, a reference voltage is equivalently set in accordance with a capacity ratio between the capacitance elements that are included in the capacitance circuit. When the input signal is amplified, a voltage to be supplied to the second electrodes of the first capacitance element and the second capacitance element is determined in accordance with an output from the quantizer that is obtained by quantization based on the reference voltage. In doing so, it is possible to reflect the output from the quantizer based on the reference voltage to the amplified signal by the control circuit supplying a power source voltage or a ground voltage to the second electrodes of the first capacitance element and the second capacitance element in accordance with the output from the quantizer. As a result, it is possible to suppress an increase in power consumption by the circuit that forms the voltage to be supplied to the second electrodes of the first capacitance element and the second capacitance element and to suppress an increase in power consumption by the analog-to-digital converter.

In addition, in an embodiment, the capacitance circuit which is included in a multiplying digital-to-analog conversion circuit includes a first capacitance bank including first and second capacitance elements, each of which includes a first electrode and a second electrode, and a second capacitance bank including third and fourth capacitance elements, each of which includes a first electrode and a second electrode. Here, when an input signal is sampled, a normal phase signal is supplied to the first electrodes of first, second, third, and fourth capacitance elements, and an opposite phase signal is supplied to the second electrodes of the first, second, third, and fourth capacitance elements. When the input signal is amplified, the first electrodes of the first and second capacitance elements serve as the output node of the multiplying digital-to-analog conversion circuit, the first electrodes of the third and fourth capacitance elements are coupled to the second electrodes of the first and second capacitance elements, and a voltage from the control circuit is supplied to the second electrodes of the third and fourth capacitance elements.

According to the embodiment, the first capacitance element and the second capacitance element in a first capacitance bank and a third capacitance element and a fourth capacitance element in a second capacitance bank are connected in series when the input signal is amplified. In doing so, it is possible to substantially quadruple an amplification gain of the multiplying digital-to-analog conversion circuit.

Furthermore, a probe for medical diagnosis is disclosed in an embodiment. The probe for medical diagnosis includes a plurality of analog-to-digital converters, each of which receives a measurement target signal as an input signal. In addition, each of the plurality of analog-to-digital converters includes a multiplying digital-to-analog conversion circuit. Here, each multiplying digital-to-analog conversion circuit includes a quantizer that quantizes the input signal based on a reference voltage, a passive circuit that samples and amplifies the input signal, a buffer circuit that receives an output from the passive circuit, and a control circuit that forms a voltage to be supplied to the passive circuit in accordance with an output from the quantizer. The passive circuit includes the aforementioned first capacitance element and the second capacitance element and is configured of passive elements. In doing so, it is possible to suppress an increase in power consumption by the passive circuit.

Furthermore, in the embodiment related to the probe for medical diagnosis, the plurality of analog-to-digital converters are formed on a single semiconductor integrated circuit device, and a common voltage is supplied to the control circuits of the plurality of analog-to-digital converters. The voltage supplied to the control circuits is a voltage supplied to the second electrodes of the first capacitance element and the second capacitance element when the input signal is amplified by the passive circuit, and is regarded as a reference voltage. By supplying the common voltage to the control circuits of the plurality of analog-to-digital converters as in the embodiment, it is possible to suppress variations in a voltage as a reference in the plurality of analog-to-digital converters, to reduce variations in measurement of the measurement target signals, and to thereby provide a probe for medical diagnosis with high precision.

Furthermore, a diagnosis system that includes the aforementioned probe for medical diagnosis and a diagnosis apparatus is disclosed in an embodiment. According to the probe for medical diagnosis, a measurement target signal is converted into a digital signal, and the digital signal is supplied as a radio signal to the diagnosis apparatus. Therefore, it is possible to provide a diagnosis system that can be easily handled.

A brief description will be given of advantages that can be achieved by the representative inventions among the inventions disclosed in this application as follows.

That is, it is possible to provide an analog-to-digital converter that is capable of suppressing an increase in an occupation area.

BRIEF DESCRIPTION OF THE DRAWINGS

FIGS. 3A and 3B are a block diagram and a timing diagram illustrating a configuration of a cyclic-type analog-to-digital converter according to the first embodiment.

DETAILED DESCRIPTION OF THE INVENTION

Figure 1:
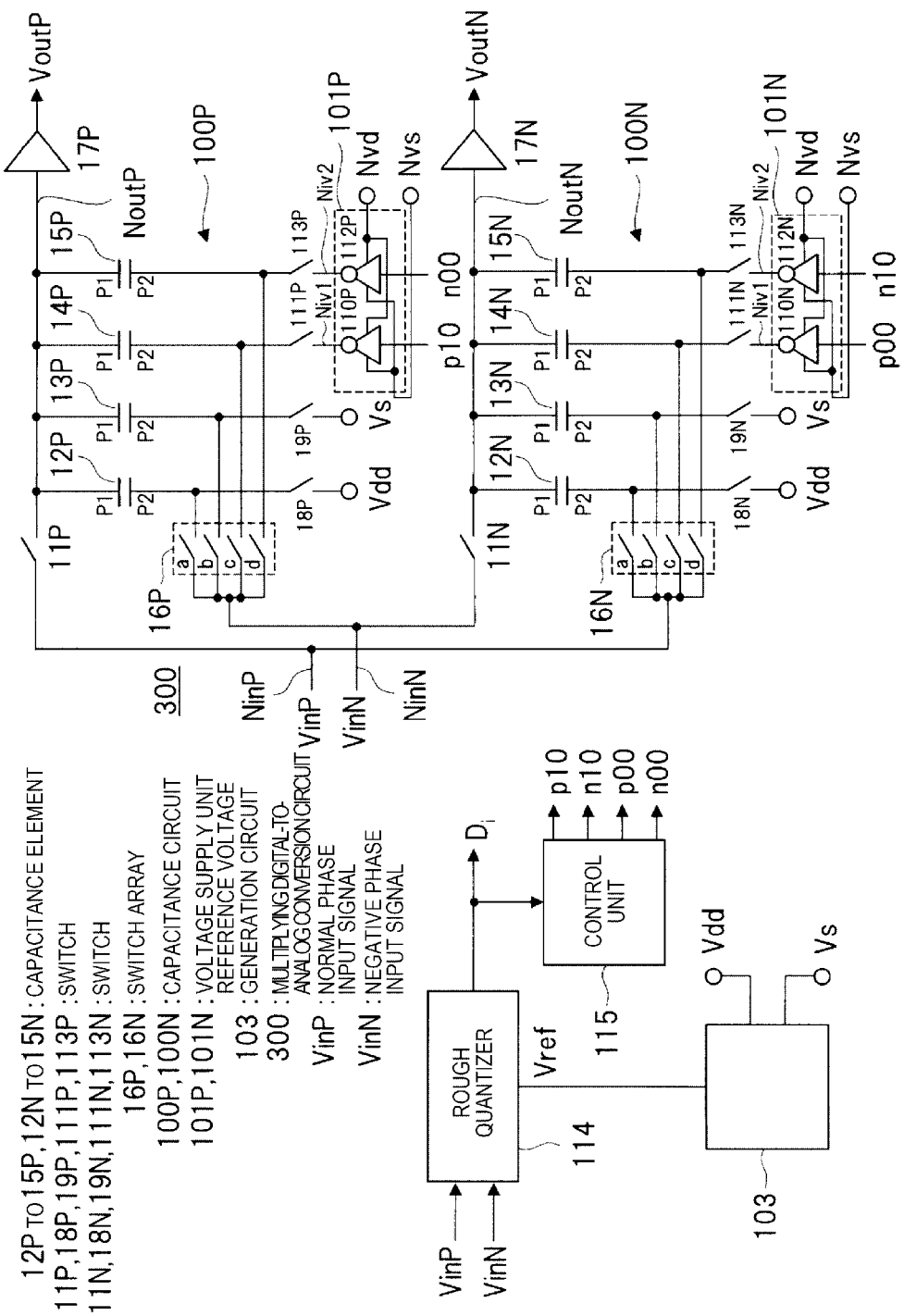
FIG. 1 is a circuit diagram illustrating a configuration of a multiplying digital-to-analog conversion circuit according to a first embodiment.

Hereinafter, a detailed description will be given of embodiments of the present invention with reference to drawings. In all the diagrams illustrating the embodiments, the same reference numerals will be given to the same components in principle, and repeated descriptions thereof will be omitted in principle.

The following embodiments will be described in a plurality of sections or as divided embodiments if necessary for the purpose of convenience, which does not mean that there is no relation between the embodiments. One embodiment is a modification example, a detailed description, or a supplemental description of a part or an entirety of another embodiment unless otherwise expressly stated. The numbers and the like (including numbers, numerical values, amounts, and ranges) of elements in the following embodiments are not intended to be limited to the particular numbers, may be equal to or greater than the particular numbers, and may be equal to or less than the particular numbers unless otherwise expressly stated and unless the numbers are obviously limited to particular numbers in principle. In addition, it is needless to say that components (including element steps) in the following embodiments are not necessarily essential unless otherwise expressly stated and unless the components are considered to be obviously essential.

Similarly, shapes, positional relationships, and the like of the components in the following embodiments include shapes, positional relationships, and the like that are substantially approximate or similar to the shapes and the like unless otherwise expressly stated and unless it is considered the approximate or similar shapes are obviously not included in principle. This is true for the aforementioned numerical values and ranges.

Basic Concept

Descriptions will be given of a plurality of embodiments. First, a description will be given of a basic concept with reference to FIG. 8. Here, a description will be given of a multiplying digital-to-analog conversion circuit. The multiplying digital-to-analog conversion circuit (MDAC) described herein configures a cyclic-type analog-to-digital converter by being used as illustrated with reference to FIGS. 9A to 9D.

Figure 8:
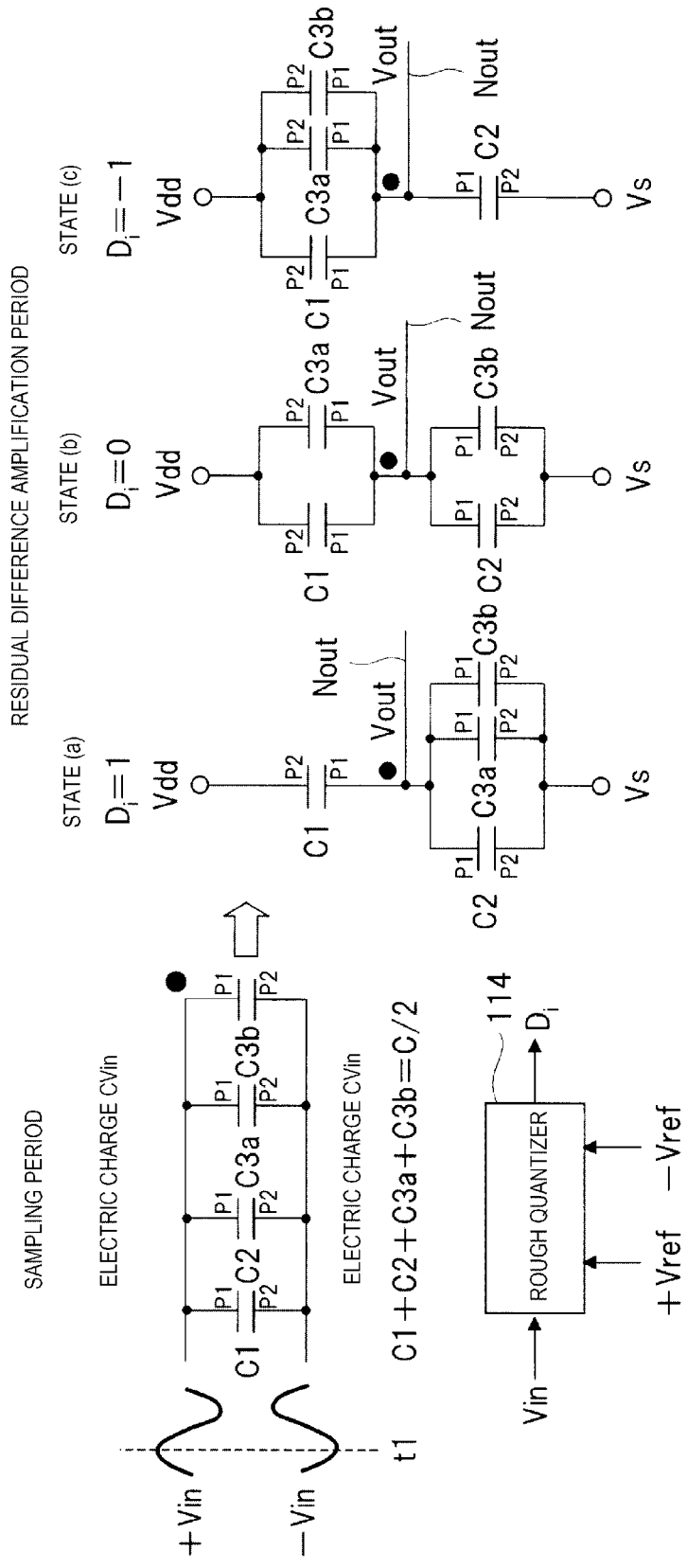
FIG. 8 is an explanatory diagram illustrating a basic concept.
Figure 9A:
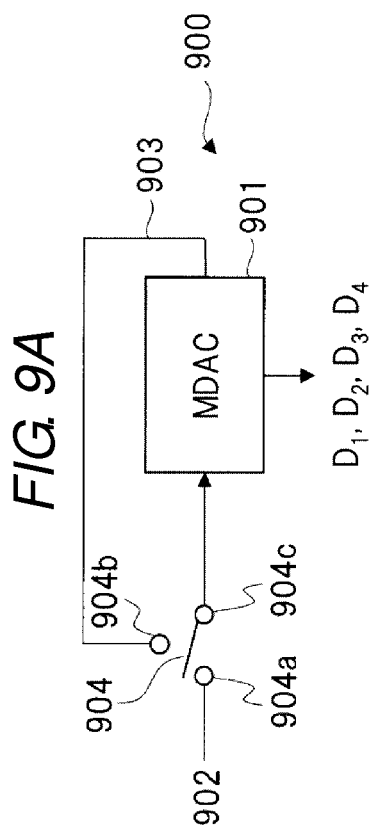
FIGS. 9A to 9D are block diagrams and timing diagrams illustrating configurations of the cyclic analog-to-digital converter that was reviewed by the present inventors.
Figure 9B:
Figure 9C:
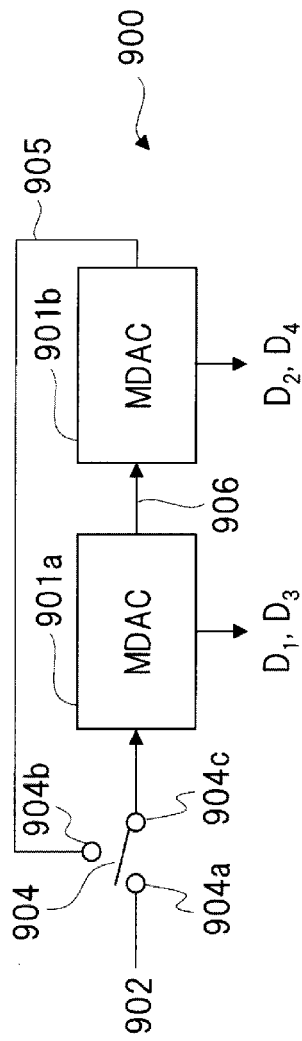
Figure 9D:
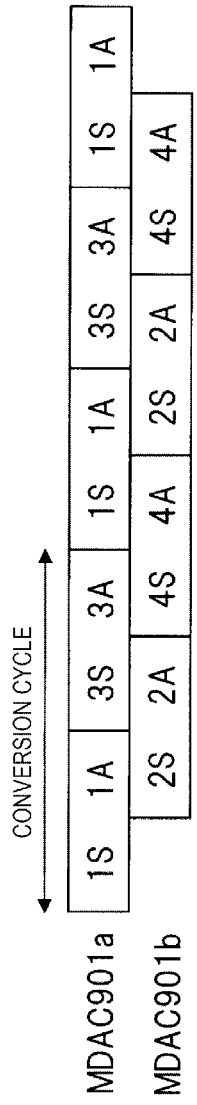
Figure 10:
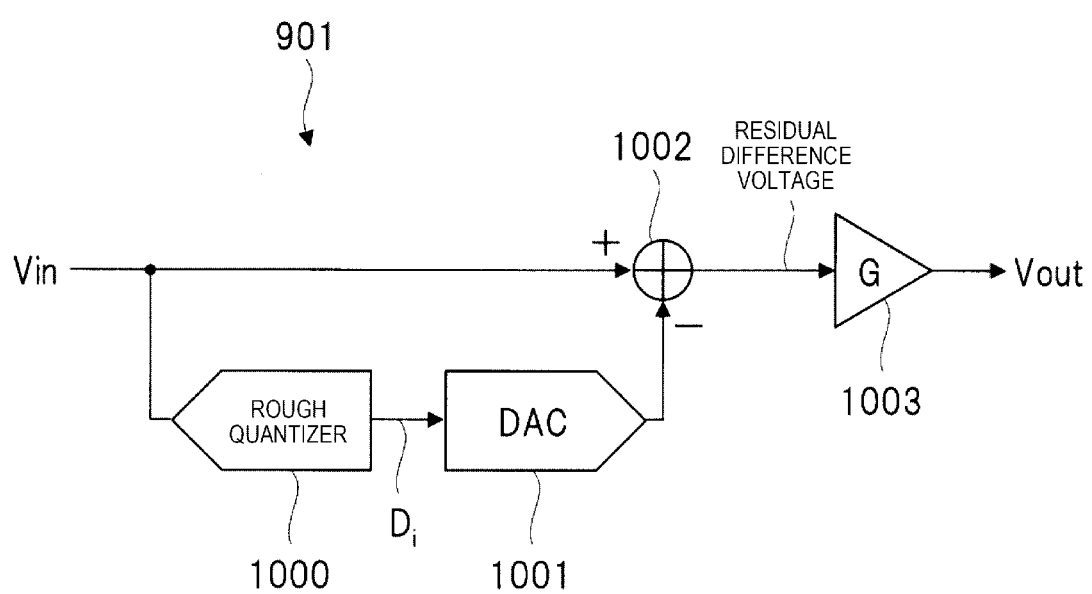
FIG. 10 is a block diagram illustrating a configuration of a multiplying digital-to-analog conversion circuit.

Although a description will be given later in the first embodiment, the MDAC includes a rough quantizer 114 that roughly quantizes an input signal Vin, a control circuit that includes a control unit 115, and a capacitance circuit that includes a plurality of capacitance elements. In order to describe the basic concept, only the rough quantizer 114 and the capacitance circuit among the elements are illustrated in FIG. 8. Since the capacitance circuit is configured of a plurality of capacitance elements, each of which is a passive element, it is possible to regard the capacitance circuit as a passive circuit. Therefore, the capacitance circuit will also be referred to as a passive circuit in this specification.

FIG. 8 is an explanatory diagram illustrating the basic concept and schematically illustrates an operation in a sampling period during which the MDAC samples an input signal and an operation in a residual error amplification period during which the sampled input signal is amplified. The sampling period is illustrated on the left side of the arrow in FIG. 8, and the residual error amplification period is illustrated on the right side of the arrow in the drawing.

In the sampling period, the input signal Vin is roughly quantized by the rough quantizer 114. That is, the rough quantizer 114 receives the reference voltages +Vref and −Vref and sets three voltage ranges by using the reference voltages +Vref and −Vref. As the three voltage ranges, (a) a voltage range that is greater than ¼ of the reference voltage +Vref, (b) a voltage range between ¼ of the reference voltage +Vref and ¼ of the reference voltage −Vref, and (c) a voltage range that is smaller than ¼ of the reference voltage −Vref are set, for example. The rough quantizer 114 performs quantization depending on where the voltage value of the input signal Vin is present in any of these voltage ranges (a) to (c), and outputs the result as a digital signal $D_i$. Here, it is assumed that the digital signal $D_i$ is "1", "0", or "−1" depending on where the voltage value of the input signal Vin is present in any of the aforementioned voltage ranges (a) to (c) for the purpose of easy explanation.

The capacitance circuit includes capacitance elements C1, C2, C3a, and C3b. In the sampling period, the capacitance elements C1, C2, C3a, and C3b are connected in parallel. That is, first electrodes P1 of the capacitance elements C1, C2, C3a, and C3b are mutually connected, and second electrodes P2 of the capacitance elements C1, C2, C3a, and C3b are mutually connected. In the sampling period, a normal phase input signal +Vin corresponding to the input signal Vin is supplied to the first electrodes P1 of the capacitance elements C1, C2, C3a, and C3b, and an opposite phase input signal −Vin with an opposite phase to that of the normal phase input signal +Vin is supplied to the second electrodes P2 of the capacitance elements C1, C2, C3a, and C3b. In the drawing, waveforms of sine waves are depicted in order to expressly illustrate that the normal phase input signal +Vin and the opposite phase input signal −Vin are inversions of each other in the same manner as in FIG. 11. However, in the sampling period, the normal phase input signal +Vin and the opposite phase input signal −Vin that are supplied to the first electrode P1 and the second electrode P2 of each capacitance element are values at a timing t1, for example.

Figure 11:
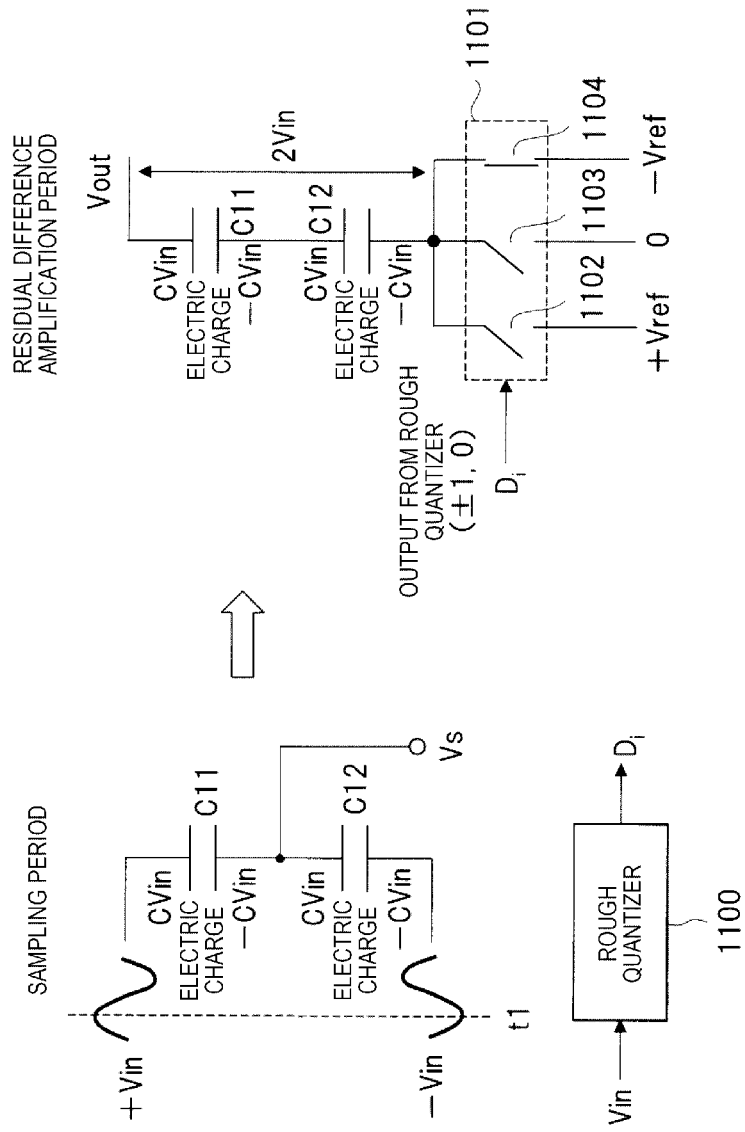
FIG. 11 is an explanatory diagram illustrating the review by the present inventors.

That is, in the sampling period, the sampling is performed in a state in which a normal phase input signal voltage and an opposite phase input signal voltage of the input differential signal are connected to the electrodes P1 and P2 at both ends of each capacitance element. In other words, complete differential sampling configured such that the normal phase signal and the opposite phase signal are supplied to both the electrodes P1 and P2 of each capacitance element (complete differential sampling) is performed instead of the pseudo differential sampling that is configured such that an input signal with a normal phase or an opposite phase is supplied to one electrode of each capacitance element and a pseudo AC ground is supplied to the other electrode as illustrated in FIG. 11 (pseudo differential sampling). In doing so, a total capacitance value of the capacitance elements C1, C2, C3a, and C3b in the capacitance circuit is only ½ of the capacitance value C of the capacitance elements (in the case in which the capacitance element C11 and the capacitance element C12 have the same capacitance value C) illustrated in FIG. 11 in a case in which the amount of electric charge with which the capacitance elements C11 and C12 in the circuit as the target of review illustrated in FIG. 11 can be charged is the same as the amount of electric charge with which the capacitance circuit illustrated in FIG. 8 can be charged. In addition, differential heat noise voltages ($k_BT/C$ noise) that are caused by resistances of the switches for sampling are logically the same in FIGS. 8 and 11.

That is, it is possible to maintain a signal-to-noise ratio in a level similar to that of the circuit as the target of review even if the total volume of the capacitance element required for the sampling is reduced to ¼ as compared with the total volume in the circuit as the target of review (FIG. 11), by performing the complete differential sampling instead of the pseudo differential sampling. In doing so, it is possible to suppress an increase in an area that is occupied by the capacitance circuit. Furthermore, since the capacitance circuit is configured of a plurality of capacitance elements C1, C2, C3a, and C3b, it is also possible to arrange the capacitance elements so as to reduce the occupation area.

As described above, the input signal Vin is quantized into a ternary number (1, 0, −1) by the rough quantizer 114 in the sampling period. In the residual error amplification period (the right side in FIG. 8), the first electrodes P1 of the capacitance elements C1, C2, C3a, and C3b are connected to each other, a common connection node corresponds to an output node Nout of the MDAC, and the output signal Vout is extracted from the output node Nout. In the residual error amplification period, the second electrode P2 of the capacitance element C1 is connected to a power source voltage Vdd, and the second electrode P2 of the capacitance element C2 is connected to a ground voltage (ground) Vs. In contrast, a voltage supplied to the second electrodes P2 of the capacitance elements C3a and C3b varies in accordance with a value of the digital signal $D_i$ that is an output from the rough quantizer 114. That is, the second electrodes P2 of the capacitance elements C3a and C3b are connected to the power source voltage Vdd or the ground voltage Vs in accordance with the value of the digital signal $D_i$. In FIG. 8, a case in which the value of the digital signal $D_i$ is "1" is illustrated as a state (a), a case in which the value of the digital signal $D_i$ is "0" is illustrated as a state (b), and a case in which the value of the digital signal $D_i$ is "−1" is illustrated as a state (c).

Typically, the capacitance element C3a and the capacitance element C3b have the same capacitance value, for example. As can be understood from the states (a) to (c) illustrated in FIG. 8, in the residual error amplification period, both the second electrodes P2 of the two capacitance elements C3a and C3b are connected to the power source voltage Vdd if the value of the digital signal $D_i$ is "−1" (state (c)), and both the second electrodes P2 of the two capacitance elements C3a and C3b are connected to the ground voltage Vs if the value of the digital signal $D_i$ is "1" (state (a)). In addition, the second electrode P2 of one capacitance element C3a of the two capacitance elements C3a and C3b is connected to the power source voltage Vdd, and the second electrode P2 of the other capacitance element C3b is connected to the ground voltage Vs if the value of the digital signal $D_i$ is "0" (state (b)). In FIG. 8, the marks • indicate the same locations in the sampling period and the residual error amplification period.

Here, a relationship between the output signal Vout and the input signal Vin of the MDAC is based on Equation (2). In Equation (2), C1 and C2 represent capacitance values of the capacitance elements C1 and C2, respectively, C3 represents a capacitance value of the capacitance element C3a (or C3b), and Vref represents the reference voltage Vref. Here, the reference voltage Vref is represented by Equation (3). In Equation (3), C1, C2, and C3 are the same as those in Equation (2). However, derivation of these equations employs implementation in a differential circuit, in which two configurations in FIG. 8 are complementarily operated as in the following respective embodiments, as an actual circuit.

According to the cyclic-type analog-to-digital converter, the output signal Vout of the MDAC is used as an input signal Vin of the MDAC in the next sampling period as described above with reference to FIGS. 9A to 9D. That is, the output signal of the MDAC is fed back as an input signal of the MDAC for a predetermined number of times, and the input signal Vin as an analog signal is converted into a digital signal $D_i$ (a plurality of bits).

$$Vout = 2\left(Vin - \frac{1}{2}D_i \cdot Vref\right) \quad (2)$$

$$Vref = \frac{2C3}{C1 + C2 + C3} \cdot Vdd \quad (3)$$

As can be understood from Equation (3), the reference voltage Vref can be equivalently determined in accordance with a ratio (capacity ratio) of the capacitance values of the capacitance elements that are included in the capacitance circuit. In the capacitance circuit illustrated in FIG. 8, the capacitance elements C1, C2, C3a, and C3b are included in the capacitance circuit, and the capacitance element C3a and the capacitance element C3b have the same capacitance value C3. Therefore, the reference value Vref is equivalently determined in accordance with the capacity ratio (Equation (3)) of these capacitance elements. As can be understood from Equation (2), the output voltage Vout of the MDAC is obtained by subtracting a product of the digital value $D_i$ obtained by the rough quantizer 114 and the reference voltage Vref from the input voltage Vin in the residual error amplification period. In this embodiment, connection of the capacitance elements C3a and C3b is changed in accordance with the output from the rough quantizer 114 in the residual error amplification period. In doing so, the output from the rough quantizer 114 and the reference voltage Vref are reflected to the amplified signal (amplified voltage).

The reference voltage Vref described herein is a reference voltage that is represented in the equation (Equation (3)) and is an equivalent reference voltage. Each of the reference voltages •Vref and −Vref corresponding to the voltage value of the equivalent reference voltage is used for quantizing the normal phase input signal +Vin and the opposite phase input signal −Vin by the rough quantizer 114. The reference voltages +Vref and −Vref that are used by the rough quantizer 114 are voltage values corresponding to the equivalent reference voltage Vref. However, a configuration of a generation circuit thereof is not limited. Precision of the reference voltages that are generated by the generation circuit is not required to be particularly high since the reference voltages are used for rough quantization. For this reason, it is only necessary to generate the voltage difference between the power source voltage Vdd and the ground voltage Vs, for example, as the reference voltages +Vref and −Vref corresponding to the equivalent reference voltage Vref by resistance voltage division or volume voltage division.

In addition, the digital value $D_i$ is reflected to the amplification operation by connecting the second electrodes of the capacitance elements C3a and C3b to the power source voltage Vdd or the ground voltage Vs. Therefore, a highly precise reference voltage generation circuit is not required. Since the reference voltages of the analog-to-digital converter are typically required to have high precision, it is known that power consumption by the reference voltage generation circuit is a bottleneck of saving power consumption by the analog-to-digital converter. Since a highly precise reference voltage generation circuit is not required, it is possible to realize low power consumption.

In the configuration of the basic concept illustrated in FIG. 8, the connection destination of the second electrodes P2 of the capacitance elements C3a and C3b is the power source voltage Vdd or the ground voltage Vs in accordance with the value of the digital signal $D_i$ in the residual error amplification period. From this viewpoint, it is possible to consider that the reference voltages are equivalently generated if a voltage dividing ratio of the power source voltage Vdd by the volume voltage division configured of the capacitance elements C1, C2, C3a, and C3b varies in accordance with the value of the digital signal $D_i$ in the residual error amplification period and a differential circuit configuration in which a complementary operation is performed is employed.

According to the configuration of the basic concept illustrated in FIG. 8, it is possible to prevent an increase in the occupation area of the capacitance circuit since the complete differential sampling is performed. In addition, since a highly precise reference voltage generation circuit is not required, it is possible to suppress an increase in power consumption.

A plurality of embodiments will be described below. Here, a cyclic-type analog-to-digital converter will be described as an example of the analog-to-digital converter that employs the multiplying digital-to-analog conversion circuit.

First Embodiment

FIG. 3A is a block diagram illustrating a configuration of a cyclic-type analog-to-digital converter according to a first embodiment, and FIG. 3B is a timing diagram illustrating an operation of the cyclic-type analog-to-digital converter.

In FIG. 3A, 300 represents a multiplying digital-to-analog conversion circuit (MDAC). The MDAC 300 will be described in detail later with reference to FIG. 1 or 2. In the same manner as the MDAC 901 described above with reference to FIG. 9A, an input signal supplied to an input node Nin of the MDAC 300 is sequentially converted into a corresponding digital signal $D_i$ (i=1 to N). Then, a residual error amplified signal that is obtained by amplifying a residual error between a voltage corresponding to the digital signal $D_i$ that is obtained by the conversion and a voltage of the input signal is output to an output node Nout. The residual error amplified signal that is delivered to the output node Nout of the MDAC 300 is supplied to a node 303b of a switch 303 via a buffer circuit 302. A node 303c of the switch 303 is connected to the input node Nin of the MDAC 300, and a node 303a of the switch 303 is connected to an output of the analog circuit 301.

In the first embodiment, the analog circuit 301 supplies the normal phase input signal +VIN corresponding to the input signal Vin (hereinafter, also referred to as VinP) and the opposite phase input signal −Vin with an opposite phase to that of the normal phase input signal +Vin (hereinafter, also referred to as VinN) to the switch 303. In order to excessively illustrate that the normal phase input signal +Vin and the opposite phase input signal −Vin are output from the analog circuit 301, an inverter circuit 304 is schematically illustrated in the analog circuit 301. It is a matter of course that generation of the normal phase input signal +Vin and the opposite phase input signal −Vin is not limited to generation by the inverter circuit, and an ordinary inversion amplifier may be used. In addition, differential outputs of a differential output-type amplifier may be respectively set to +Vin and −Vin.

The node 303c of the switch 303 is connected to the node 303a when the normal phase input signal +Vin and the opposite phase input signal −Vin corresponding to the input signal Vin (analog signal) are converted into digital signals, that is, when analog-to-digital conversion is performed. In doing so, a voltage value of the input signal Vin (the normal phase input signal +Vin, the opposite phase input signal −Vin) when the analog-to-digital conversion is performed is supplied to the input node Nin of the MDAC 300. In contrast, the node 303c of the switch 303 is connected to the node 303b in the period during which the analog-to-digital conversion is performed. In doing so, the residual error amplified signal as an output from the MDAC 300 is supplied to the input node Nin of the MDAC 300 via the buffer circuit 302 and the switch 303 in the period of the analog-to-digital conversion.

If the switch 303 illustrated in FIG. 3A is moved to the lower side, that is, if the node 303a is connected to the node 303c, the MDAC 300 performs the conversion operation as illustrated in FIG. 3B. By moving the switch 303 to the lower side, the input signal Vin (+Vin, −Vin) supplied to the input node Nin is sampled in the sampling period 1S, and the digital value $D_i$ is generated. In addition, a residual error between the input signal Vin (+Vin, −Vin) and the voltage corresponding to the digital value $D_1$ is amplified in a residual error amplification period 1A. The digital value $D_1$ is output as a digital signal that is obtained by the conversion operation. In contrast, the residual error amplified signal after the amplification is supplied to the input node Nin via the buffer circuit 302 and the switch 303 and is then sampled in a next sampling period 2S, a digital value $D_2$ is output, and the amplification operation is performed in a residual error amplification period 2A.

The aforementioned operations are repeated (1S, 1A, ... NS, NA) the number of times corresponding to a required bit number of the digital signal. Thereafter, the switch 303 is moved to the lower side, an input signal with a new voltage value is delivered to the input node Nin, and the analog-to-digital conversion operation is performed on the new input signal (1S, 1N, ... ). In FIG. 3B, the analog-to-digital conversion is performed by a single multiplying digital-to-analog conversion circuit 300. Therefore, a conversion cycle of the multiplying digital-to-analog conversion circuit 300 is from 1A to NA.

Next, a description will be given of the multiplying digital-to-analog conversion circuit 300 with reference to FIG. 1. FIG. 1 is a circuit diagram illustrating a configuration of the multiplying digital-to-analog conversion circuit (MDAC) 300.

The MDAC 300 includes capacitance circuits 100P and 100N, a rough quantizer 114, a control unit 115, a voltage supply units 101P and 101N. The capacitance circuits 100P and 100N have the same configuration, and the voltage supply units 101P and 101N have the same configurations. Here, the capacitance circuit 100P and the voltage supply circuit 101P are used to amplify a residual error signal related to the normal phase input signal +Vin, and the capacitance circuit 100N and the voltage supply circuit 101N are used to amplify a residual error signal related to the opposite phase input signal −Vin. The residual error amplified signal that is amplified by the capacitance circuit 100P and the voltage supply unit 101P is delivered to an output node NoutP and is then delivered to an input of a buffer circuit 17P. Similarly, the residual error amplified signal that is amplified by the capacitance circuit 100N and the voltage supply unit 101N is delivered to an output node Nout N and is the delivered to an input of a buffer circuit 17N.

Although FIG. 1 illustrates the buffer circuits 17P and 17N for the purpose of explanation, these buffer circuits 17P and 17N are collectively illustrated as the buffer circuit 302 in FIGS. 3A and 3B. In addition, the two output nodes NoutP and NoutN illustrated in FIG. 1 are collectively illustrated as the output node Nout in FIGS. 3A and 3B. Similarly, the input nodes NinP and NinN illustrated in FIG. 1 are illustrated as the input node Nin in FIGS. 3A and 3B.

Although a single switch is illustrated as the switch 303 in FIGS. 3A and 3B, the switch 303 includes a first switch (not shown) that supplies the normal phase input signal +Vin (VinP) from the analog circuit 304 or the buffer circuit 17P to the input node NinP and a second switch (not shown) that supplies the opposite phase input signal −Vin (VinN) from the analog circuit 304 or the buffer circuit 17N to the input node NinN.

The rough quantizer 114 is connected to the input nodes NinP and NinN of the MDAC 300. The rough quantizer 114 roughly quantizes a differential voltage between the normal phase input signal VinP and the opposite phase input signal VinN that are supplied via the switch 303 (FIGS. 3A and 3B). In the first embodiment, the differential voltage is quantized to a ternary number, and data obtained by the quantization is output as the digital value $D_i$. The digital value $D_i$ that is output from the rough quantizer 114 is supplied to the control unit 115 and is output as a result of the analog-to-digital conversion. The MDAC 300 according to the first embodiment is a so-called 1.5-bit converter. Therefore, the voltage of the input signal Vin as an analog signal is converted into a plurality bits (binary expression) of digital signals by performing computation processing of a plurality of digital values $D_i$ (i=1 to N) that are obtained in one conversion cycle.

The control unit 115 receives the output (digital value Di) from the rough quantizer 114, generates control signals p00, n00, p10, or n10 in accordance with the output, and supplies the control signal to the voltage supply units 101P and 101N. The voltage supply units 101P and 101N supplies a voltage in accordance with the control signal from the control unit 115 to the capacitance circuits 100P and 100N in the residual error amplification period. Therefore, it is possible to collectively regard the control unit 115 and the voltage supply units 101P and 101N as a control circuit of controlling the voltage to be supplied to the capacitance circuit.

The capacitance circuit 100P samples the normal phase input signal VinP and the opposite phase input signal VinN in the sampling period, and amplifies a voltage difference between the sampled normal phase input signal VinP and the opposite phase input signal VinN in the residual error amplification period. In addition, the output (digital value $D_i$) from the rough quantizer 114 and the equivalent reference voltage Vref are reflected to the voltage that is obtained by the amplification in the residual error amplification period. The amplification output that reflects the output from the rough quantizer 114 and the equivalent reference voltage Vref appears at the output node NoutP and is then delivered to the input of the buffer circuit 17P. Similarly, the capacitance circuit 100N samples the opposite phase input signal VinN and the normal phase input signal VinN in the sampling period, and amplifies a voltage difference between the sampled opposite phase input signal VinN and the normal phase input signal VinP in the residual error amplification period. In addition, the output (digital value Di) from the rough quantizer 114 and the equivalent reference voltage Vref are reflected to the voltage that is obtained by the amplification in the residual error amplification period. The amplification output that reflects the output from the rough quantizer 114 and the equivalent reference voltage Vref appears at the output node NoutN and is then delivered to the input of the buffer circuit 17N.

The capacitance circuit 100P includes a switch 11P that is connected between the input node NinP and the output node NoutP and capacitance elements 12P, 13P, 14P, and 15P, the first electrodes P1 of which are connected to the output node NoutP. In addition, the capacitance circuit 100P includes a switch array 16P that is connected between the second electrodes P2 of the capacitance elements 12P to 15P and the input node NinN, a switch 18P that is connected between the second electrode P2 of the capacitance element 12P and the power source voltage Vdd, and a switch 19P that is connected between the second electrode P2 of the capacitance element 13P and the ground voltage Vs. Furthermore, the capacitance circuit 100P includes a switch 111P that is connected between the second electrode P2 of the capacitance element 14P and an output node Niv1 of the voltage supply unit 101P and a switch 113P that is connected between the second electrode P2 of the capacitance element 15P and an output node Niv2 of the voltage supply unit 101P.

Here, the switch array 16P is a switch group configured of switches a to d, switch a is connected between an input node NinN and the second electrode P2 of the capacitance element 12P, and the switch b is connected between the input node NinN and the second electrode P2 of the capacitance element 13P. Similarly, the switch c is connected between the input node NinN and the second electrode P2 of the capacitance element 14P, and the switch d is connected between the input node NinN and the second electrode P2 of the capacitance element 15P.

The switch 11P and the switch array 16P are brought into an ON state in the sampling period (1S in FIGS. 3A and 3B, for example), and is brought into an OFF state in the residual error amplification period (1A in FIGS. 3A and 3B, for example). In doing so, the first electrodes P1 of the capacitance elements 12P to 15P are connected to the input node NinP via the switch 11P, and the second electrodes P2 thereof are connected to the input node NinN via the switch array 16P (switches a to d) in the sampling period (1S). As a result, the normal phase input signal VinP and the opposite phase input signal VinN are applied to the capacitance elements 12P to 15P in the sampling period (1S), and the complete differential sampling is performed. In addition, the switches 18P, 19P, 111P, and 113P are brought into the OFF state in the sampling period (1S).

In contrast, the switch 11P and the switch array 16P are brought into the OFF state, and the switches 18P, 19P, 111P, and 113P are brought into the ON state in the residual error amplification period (1A) following the sampling period (1S). In doing so, the power source voltage Vdd is supplied to the second electrode P2 of the capacitance element 12P via the switch 18P, and the ground voltage Vs is supplied to the second electrode P2 of the capacitance element 13P via the switch 19P in the residual error amplification period (1A). At this time, voltages in accordance with the output from the rough quantizer 114 are supplied from the output nodes Niv1 and Niv2 of the voltage supply unit 101P to the second electrodes P2 of the capacitance elements 14P and 15P via the switches 111P and 113P.

The voltage supply unit 101P includes inverter circuits 110P and 112P though not particularly limited. The inverter circuit 110P receives the control signal p10 from the control unit 115 and supplies a voltage, which is obtained by inverting the voltage of the control signal p10, to the output node Niv1 of the voltage supply unit 101P. In addition, the inverter circuit 112P receives the control signal n00 from the control unit 115 and supplies a voltage, which is obtained by inverting the voltage of the control signal n00, to the output node Niv2 of the voltage supply unit 101P. Here, the power source voltage Vdd and the ground voltage Vs are supplied as operation voltages to the voltage supply unit 101P. The power source voltage Vdd is supplied via a power source node Nvd, and the ground voltage Vs is supplied via a power source node Nvs. That is, the power source voltage Vdd and the ground voltage Vs as operation voltages are supplied to the inverter circuits 110P and 112P via the power source nodes Nvd and Nvs, respectively.

By receiving the power source voltage Vdd and the ground voltage Vs as the operation voltages, the inverter circuits 110P and 112P supply the power source voltage Vdd supplied to the power source node Nvd or the ground voltage Vs supplied to the power source node Nvs to the second electrodes P2 of the capacitance elements 14P and 15P in accordance with the voltages of the control signals p10 and n00. That is, according to the first embodiment, the voltages to be supplied to the capacitance circuit 100P are the power source voltage Vdd and the ground voltage Vs, and a highly precise reference voltage is not supplied. In addition, the first electrodes P1 of the capacitance elements 12P to 15P are connected to the output node NoutP in both the sampling period (1S) and the residual error amplification period (1A).

The capacitance circuit 100N also has the same configuration as that of the capacitance circuit 100P. That is, the capacitance circuit 100N includes a switch 11N that is connected between the input node NinN to which the opposite phase input signal VinN is supplied and the output node NoutN, capacitance elements 12N to 15N, the first electrodes P1 of which are connected to the output node NoutN, and a switch array 16N (switches a to d) that is connected between the input node NinP to which the normal phase input signal VinP is supplied and the second electrodes P2 of the capacitance elements 12N to 15N. In addition, the capacitance circuit 100N includes a switch 18N that is connected between the second electrode P2 of the capacitance element 12N and the power source voltage Vdd, a switch 19N that is connected between the second electrode P2 of the capacitance element 13N and the ground voltage Vs, a switch 111N that is connected to the second electrode P2 of the capacitance element 14N and the output node Niv1 of the voltage supply unit 101N, and a switch 113N that is connected between the second electrode P2 of the capacitance element 15N and the output node Niv2 of the voltage supply unit 101N.

The switches 11N, 18N, 19N, 111N, and 113N and the switch array 16N in the capacitance circuit 100N correspond to the switches 11P, 18P, 19P, 111P, and 113P and the switch array 16P in the capacitance circuit 100P, respectively. That is, the switch 11N and the switch array 16N are brought into the ON state in the sampling period (1S) and are brought into the OFF state in the following residual error amplification period (1A). In doing so, the voltage of the opposite phase input signal VinN and the voltage of the normal phase input signal VinP are applied to the first electrodes P1 and the second electrodes P2 of the respective capacitance elements 12N to 15N in the sampling period (1S), and the complete differential sampling is performed. In contrast, the switches 18N, 19N, 111N, and 113N are brought into the ON state in the residual error amplification period (1A). In doing so, the power source voltage Vdd is supplied to the second electrode P2 of the capacitance element 12N, and the ground voltage Vs is supplied to the second electrode P2 of the capacitance element 13N in the residual error amplification period (1A).

In addition, voltages in accordance with the output from the rough quantizer 114 are supplied from the output nodes Niv1 and Niv2 of the voltage supply unit 101N to the second electrodes P2 of the capacitance elements 14N and 15N in the residual error amplification period (1A). The voltage supply unit 101N is also configured of the inverter circuits 110N and 112N in the first embodiment in the same manner as the aforementioned voltage supply unit 101P, and the power source voltage Vdd is supplied to the inverter circuits 110N and 112N via the power source node Nvd, and the ground voltage Vs is supplied thereto via the power source node Nvs. In doing so, the inverter circuit 110N supplies the power source voltage Vdd that is obtained by inverting the voltage of the control signal p00 or the ground voltage Vs to the output node Niv1 in the residual error amplification period (1A). Similarly, the inverter circuit 112N supplies the power source voltage Vdd that is obtained by inverting the voltage of the control signal n10 or the ground voltage Vs to the output node Niv2. As can be understood from the drawing, the second electrodes P2 of the capacitance elements 12N to 15N are also connected to the output node NoutN in the capacitance circuit 100N.

The voltages at the output nodes NoutP and NoutN of the MDAC 300 are buffered by the buffer circuits 17P and 17N and are supplied as output signals VoutP and VoutN of the buffer circuits 17P and 17N to the switch 303 (FIGS. 3A and 3B). The output signals VoutP and VoutN from the buffer circuits 17P and 17N are supplied as the normal phase input signal VinP and the opposite phase input signal VinN to the input node Nin (NinP, NinN) of the MDAC 300 for the next conversion operation during the conversion cycle, that is, in a period during which the node 303b and the node 303c of the switch 303 are connected. In FIG. 1, 103 represents a reference voltage generation circuit. The reference voltage generation circuit 103 includes a resistance element or a capacitance element for voltage division though not particularly limited, receives the power source voltage Vdd and the ground voltage Vs, and supplies a divided voltage, which is formed by dividing a differential voltage between the power source voltage Vdd and the ground voltage Vs, as the reference voltage Vref to the rough quantizer 114.

In the first embodiment, the capacitance elements 12P and 12N correspond to the capacitance element C1 described above with reference to FIG. 8, and the capacitance elements 13P and 13N correspond to the capacitance element C2 in FIG. 8. Furthermore, the capacitance elements 14P and 14N in the first embodiment correspond to the capacitance element C3a in FIG. 8, and the capacitance elements 15P and 15N correspond to the capacitance element C3b in FIG. 8. Therefore, the first embodiment can be considered as an application of the basic configuration, which was described above with reference to FIG. 8, to the conversion of the normal phase input signal VinP and the opposite phase input signal VinN. The differential voltage (the voltage at the output node NoutP–the voltage at the output node NoutN) that is output from the MDAC 300 corresponds to the differential voltage (VoutP–VoutN) between the output signal VoutP of the buffer circuit 17P and the output signal VoutN of the buffer circuit 17N.

Next, a description will be given of operations of the MDAC 300 illustrated in FIG. 1. The input signal Vin is an analog signal, and the voltage of the normal phase input signal VinP varies in accordance with variations in the voltage of the input signal Vin. A voltage waveform of the opposite phase input signal VinN has an opposite phase to that of the normal phase input signal VinP. Here, a description will be given on the assumption that the opposite phase input signal VinN has a voltage waveform with an opposite phase to that of the normal phase input signal VinP by using a common voltage as a center.

First, the normal phase input signal VinP and the opposite phase input signal VinN corresponding to the input signal Vin are supplied to the input node Nin (NinP, NinN in FIG. 1) of the MDAC 300 via the switch 303 illustrated in FIGS. 3A and 3B. In the sampling period (1S in FIGS. 3A and 3B), the switches 11P and 11N and the switch arrays 16P and 16N are brought into the ON state. In doing so, the voltage of the normal phase input signal VinP that is delivered via the switch 303 is applied to the first electrodes P1 of the capacitance elements 12P to 15P and the second electrodes P2 of the capacitance elements 12N to 15N. At this time, the voltage of the opposite phase input signal VinN that is delivered via the switch 303 is applied to the second electrodes P2 of the capacitance elements 12P to 15P and the first electrodes P1 of the capacitance elements 12N to 15N. In doing so, the respective capacitance elements 12P to 15P and 12N to 15N are charged with the voltage applied to the first electrodes P1 and the voltage applied to the second voltages P2. Since the voltages of the differential input signals (VinP, VinN) are applied to the first electrodes P1 and the second electrode P2 of the respective capacitance elements, the complete differential sampling is performed.

Figure 12:
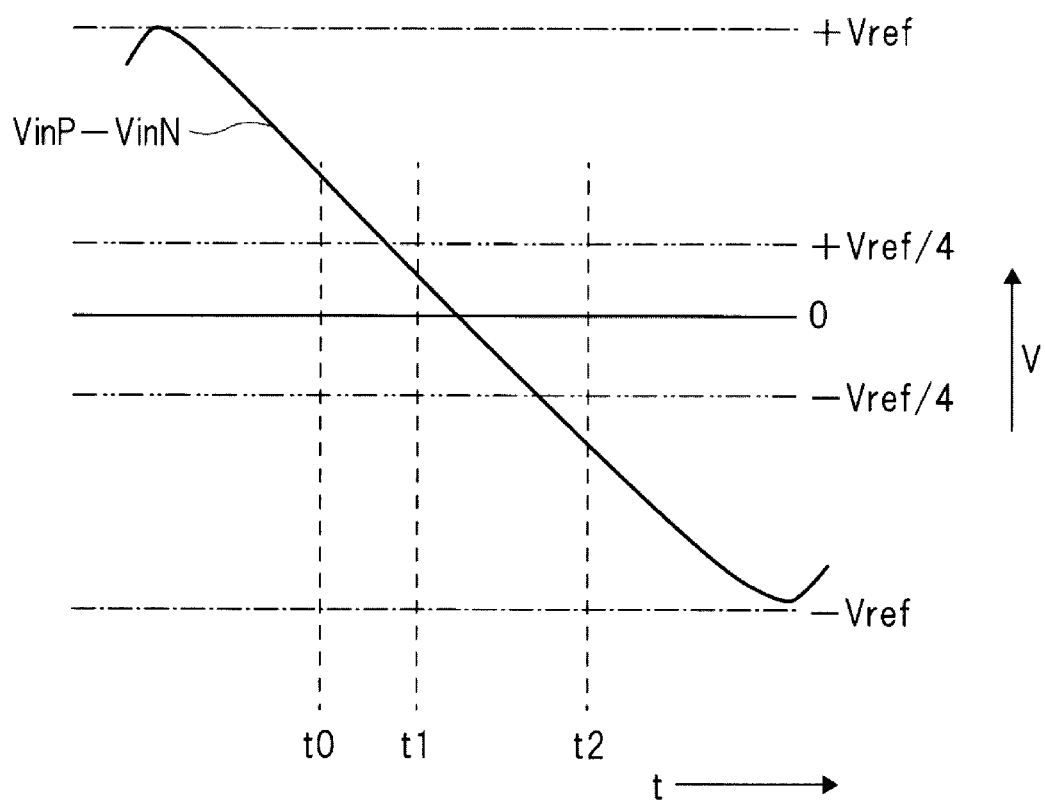
FIG. 12 is a waveform diagram illustrating an operation of the multiplying digital-to-analog conversion circuit.

In contrast, the normal phase input signal VinP and the opposite phase input signal VinN are supplied to the rough quantizer 114 via the switch 303 (FIGS. 3A and 3B) in the sampling period (1S). The rough quantizer 114 roughly quantizes the input signals. According to the first embodiment, the rough quantizer 114 quantizes the differential voltage between the voltage of the supplied normal phase input signal VinP and the voltage of the opposite phase input signal VinN, that is, the differential voltage that corresponds to the voltage of the normal phase input signal VinP−the voltage of the opposite phase input signal (VinP−VinN) based on the comparison with the reference voltage Vref. FIG. 12 is a waveform diagram illustrating a relationship between the reference voltage Vref and the differential voltage (VinP−VinN).

In FIG. 12, the horizontal axis represents time, and vertical axis represents a voltage. The reference voltages Vref include a reference voltage +Vref on the positive side and a reference voltage −Vref on the negative side around zero as a center. In such a case, an absolute value voltage of the reference voltage +Vref is the same as an absolute value voltage of the reference voltage −Vref. Such reference voltages +Vref and −Vref can be easily generated by dividing the voltage between the ground voltage Vs and the power source voltage Vdd as described above. In addition, the reference voltages +Vref and −Vref are reference voltages for roughly performing quantization and are not required to have high precision. FIG. 1 illustrates the reference voltage generation circuit 103 as a circuit of generating the reference voltages +Vref and −Vref, and the reference voltages +Vref and −Vref are collectively illustrated as the reference voltage Vref in the drawing.

A voltage waveform of the normal phase input signal VinP and a voltage waveform of the opposite phase input signal VinN vary symmetrically around the common voltage as a center. Therefore, the differential voltage (VinP−VinN) between the input differential signals VinP and VinN increases as the voltage difference between the input voltage and the common voltage increases. FIG. 12 schematically illustrates a voltage waveform of the differential voltage (VinP−VinN) as an example. In the example of the differential voltage illustrated in FIG. 12, a case in which the voltage of the normal phase input signal VinP changes to the voltage on the negative side with respect to the common voltage and the opposite phase input signal VinN changes to the voltage on the positive side with respect to the common voltage from a state in which the normal phase input signal VinP has a voltage on the positive side with respect to the common voltage and the opposite phase input signal VinN has a voltage on the negative side with respect to the common voltage is illustrated. By such variations in voltages of the normal phase input signal VinP and the opposite phase input signal VinN, the voltage value of the differential voltage (VinP−VinN) varies from the positive side to the negative side over time. In addition, the positive side represents the side of the reference voltage +Vref, and the negative side represents the side of the reference voltage −Vref in this drawing.

In the first embodiment, the input differential signal is quantized by using a voltage corresponding to ¼ of the reference voltage Vref (+Vref, −Vref) as a threshold voltage although not particularly limited. That is, it is determined whether the differential voltage (VinP−VinN) of the input differential signal (a) is greater than the reference voltage Vref/4, (b) is in a range from the reference voltage Vref/4 to the reference voltage −Vref/4, or (c) is smaller than the reference voltage −Vref/4, and the input differential signal is quantized. By performing such a determination, the rough quantizer 114 outputs "1" as the digital signal $D_i$ when the differential voltage of the input differential signal satisfies (a), for example, outputs "0" as the digital signal $D_i$ when the differential voltage of the input differential signal satisfies (b), for example, and outputs "−1" as the digital signal $D_i$ when the differential voltage of the input differential signal satisfies (c), for example.

A description will be given of the example in FIG. 12. In a case in which the analog-to-digital converter takes the input signals VinP and VinN at the timing t0, the rough quantizer 114 makes the determination (a) since the differential voltage of the input differential signal is greater than the reference voltage Vref/4, and the rough quantizer 114 outputs the digital signal $D_i$=1. In a case in which the input signals VinP and VinN at the timing t1 are taken, the rough quantizer 114 outputs the digital signal $D_i$=0 since the differential voltage of the input differential signal is in the range from the reference voltage +Vref/4 to −Vref/4. Similarly, in a case in which the input signals VinP and VinN at the timing t2 are taken, the rough quantizer 114 outputs the digital signal $D_i$=−1 since the differential voltage is smaller than the reference voltage −Vref/4.

When the digital signal $D_i$ of the rough quantizer 114 is converted into a binary digital value, the digital signal $D_i$=1 is made to correspond to the binary digital value "10", the digital signal $D_i$=0 is made to correspond to "01", and the digital signal $D_i$=−1 is made to correspond to "00" although not particularly limited. In doing so, so-called 1.5-bit conversion is performed.

The control unit 115 receives the digital signal $D_i$ as the output from the rough quantizer 114 and generates control signal p10, n10, p00, or n00 in accordance with the value of the digital signal $D_i$. In this example, the control signal p10 is generated so as to be in a high level (power source voltage Vdd) when the digital signal $D_i$ is "1" and in a low level (ground voltage Vs) in other cases. In addition, the control signal n10 is generated so as to be in the low level (Vs) when the digital signal $D_i$ is "1" and in a high level (Vdd) in other cases. The control signal p00 is generated so as to be in the high level (Vdd) when the digital signal $D_i$ is "−1" and in the low level (Vs) in other cases. The control signal n00 is generated so as to be in the low level (Vs) when the digital signal $D_i$ is "−1" and in the high level (Vdd) in other cases.

The switches 11P and 11N are brought into the OFF state in the residual error amplification period (1A) following the sampling period (1S). In addition, the switch arrays 16P and 16N are brought into the OFF state. In contrast, the switches 18P, 19P, 111P, 113P, 18N, 19N, 111N, and 113N are respectively shifted from the OFF state to the ON state in the residual error amplification period. In doing so, the second electrodes P2 of the capacitance elements 12P and 12N are connected to the power source voltage Vdd, and the second electrodes P2 of the capacitance elements 13P and 13N are connected to the ground voltage Vs in the residual error amplification period.

In the residual error amplification period, the voltages of the second electrodes P2 of the capacitance elements 14P, 15P, 14N, and 15N are determined by the voltage supply units 101P and 101N. Since the voltages output from the voltage supply units 101P and 101N are determined in accordance with the control signal form the control unit 115, the voltages of the second electrodes P2 of the capacitance elements 14P, 15P, 14N, and 15N are determined in accordance with the output (digital signal $D_i$) from the rough quantizer 114.

That is, when the digital signal $D_i$ is "1", the control signals p10 and n00 are in the high level, and a ground voltages in accordance with the ground voltage Vs supplied to the power source node Nvs are supplied from the inverter circuits 110P and 112P to the second electrodes P2 of the capacitance elements 14P and 15P, respectively. Since the control signals p00 and n10 are in the low level at this time, the power source voltages in accordance with the power source voltage Vdd supplied to the power source node Nvd are supplied from the inverter circuits 110N and 112N to the second electrodes of the capacitance elements 14N and 15N, respectively. In doing so, the connection state of the capacitance elements 12P to 15P becomes the same as the state (a) illustrated in FIG. 8, and the connection state of the capacitance elements 12N to 15N becomes the same as the state (c) illustrated in FIG. 8. As described above, the capacitance elements 12P and 12N correspond to the capacitance element C1 in FIG. 8, and the capacitance elements 13P and 13N corresponds to the capacitance element C2 in FIG. 8. In addition, the capacitance elements 14P and 14N corresponds to the capacitance element C3a in FIG. 8, and the capacitance elements 15P and 15N corresponds to the capacitance element C3b in FIG. 8.

In addition, when the digital signal $D_i$ is "−1", the control signals p10 and n00 are in the low level. Therefore, the power source voltages in accordance with the power source voltage Vdd supplied to the power source node Nvd is supplied from the inverter circuits 110P and 112P to the second electrodes P2 of the capacitance elements 14P and 15P, respectively. Since the control signals p00 and n10 are in the high level at this time, the ground voltages in accordance with the ground voltage Vs supplied to the power source node Nvs is supplied from the inverter circuits 110N and 112N to the second electrodes P2 of the capacitance elements 14N and 15N. In doing so, the connection state of the capacitance elements 12P to 15P becomes the same as the state (c) illustrated in FIG. 8, and the connection state of the capacitance elements 12N to 15N becomes the same as the state (a) illustrated in FIG. 8.

Furthermore, when the digital signal $D_i$ is "0", the control signal p10 is in the low level, and the control signal n00 is in the high level. Therefore, the power source voltage in accordance with the power source voltage Vdd is supplied from the inverter circuit 110P to the second electrodes P2 of the capacitance element 14P, and the ground voltage in accordance with the ground voltage Vs is supplied from the inverter circuit 112P to the second electrode P2 of the capacitance element 15P. Since the control signal p00 is in the low level and the control signal n10 is in the high level at this time. The power voltage in accordance with the power source voltage Vdd is supplied from the inverter circuit 110N to the second electrode P2 of the capacitance element 14N, and the ground voltage in accordance with the ground voltage Vs is supplied from the inverter circuit 112N to the second electrode P2 of the capacitance element 15N. In doing so, the connection state of the capacitance elements 12P to 15P becomes the same as the state (b) illustrated in FIG. 8, and the connection state of the capacitance elements 12N to 15N becomes the same as the state (b) illustrated in FIG. 8.

In the residual error amplification period, the connection states of the capacitance elements 12P to 15P (12N to 15N) of the capacitance circuits 100P and 100N change in the same manner as in the state illustrated in FIG. 8 in accordance with the output of the digital signal $D_i$ as described above. Therefore, the differential voltage Vout (VoutP−VoutN) between the output voltage VoutP corresponding to the voltage at the output node NoutP (corresponding to the output node of the MDAC 300) of the capacitance circuit 100P and the output voltage VoutN corresponding to the voltage at the output node NoutN (corresponding to the output node of the MDAC 300) of the capacitance element 100N is based on the aforementioned Equation (2). In such a case, the output voltage Vout in Equation (2) is considered as a differential voltage between VoutP and VoutN instead, the input voltage Vin is considered as a differential voltage between VinP and VinN, and the reference voltage Vref is considered as +Vref or −Vref instead.

In the first embodiment, the output nodes NoutP and NoutN are connected to the inputs of the buffer circuits 17P and 17N. Since buffering is performed by the buffer circuits 17P and 17N, the output nodes of the buffer circuits 17P and 17N are electrically isolated from the aforementioned output nodes NoutP and NoutN. In doing so, it is possible to prevent electrical charge dispersion between a capacitance (a sum of the sampling capacitance of the next stage and the parasitic capacitance) that is present in the output nodes of the buffer circuits 17P and 17N and the capacitance elements 12P to 15P and 12N to 15N that are included in the capacitance circuits 100P and 100N when the output voltages at the output nodes NoutP and NoutN are delivered to the output nodes of the buffer circuits 17P and 17N. In addition, since input impedances of the buffer circuits 17P and 17N are high, it is possible to prevent the values of the output voltage at the output nodes NoutN and NoutP from changing (breaking) and to maintain the values of the differential voltages to be applied to the inputs of the buffer circuits 17P and 17N.

Since the capacitance elements 12P to 15P and 12N to 15N that are included in the capacitance circuits 100P and 100N hold electrical charge that corresponds to the supplied input signal Vin (+Vin, −Vin) in the sampling period, it is not necessary to provide a holding circuit for holding the input signal between the switch 303 (FIGS. 3A and 3B) and the MDAC 300. It is a matter of course that the holding circuit may be provided in order to allow deviations between sampling timings of the capacitance circuits 100P and 100N and a determination timing of the rough quantizer 114.

According to the first embodiment, the output signal (voltage) at the output node Nout (NoutP, NoutN) of the MDAC 300 illustrated in FIG. 1 is supplied to the input node Nin (NinP, NinN) of the MDAC 300 illustrated in FIG. 1 again via the buffer circuit 302 (17P, 17N) and the switch 303. The aforementioned rough quantization and the complete differential sampling are performed on the supplied output signal as the input signal Vin (Vine, VinN) in the sampling period (2S), and furthermore, the aforementioned residual error amplification is performed thereon in the residual error amplification period (2A). By repeating the sampling period and the residual error amplification period following the sampling period as described above, the input signal Vin (Vine, VinN) is converted into a predetermined bit number of digital signals. Since the processing of converting the quantized data that is obtained by the so-called 1.5-bit conversion into a binary digital signal is known, the description thereof will be omitted herein.

Although not shown in the drawing, the cyclic-type analog-to-digital converter includes a control circuits that controls the aforementioned switches 11P, 18P, 19P, 111P, 113P, 11N, 18N, 19N, 111N, and 113N, the switch 303 (FIGS. 3A and 3B), and the switch arrays 16P and 16N. The control circuit performs control to turning on and off predetermined switches and switch arrays in the sampling period and the residual error amplification period. In addition, the switch 303 is controlled such that the input signal is supplied to the MDAC 300 at a predetermined timing. Furthermore, the rough quantizer 114 and the control unit 115 are also controlled by the control circuit. The rough quantizer 114 is controlled so as to perform the quantization in the sampling period, and the control unit 115 is controlled so as to supply the control signals p10, n00, p00, and n10 in accordance with the output from the rough quantizer 114 to the voltage supply units 101P and 101N in the residual error amplification period.

Next, a relationship of the power source voltage Vdd, the reference voltage Vref (+Vref, −Vref), a common (average) voltage Vcm of inputs of the buffer circuits 17P and 17N, and the respective capacitance values of the capacitance elements 12P to 15P (12N to 15N) that are included in the capacitance circuit 100P (100N) will be described. In addition, the capacitance element 12P (12N) will be represented as a capacitance element C1, the capacitance element 13P (13N) will be represented as a capacitance element C2, and the capacitance elements 14P (14N) and 15P (15N) will be represented as capacitance elements C3, respectively.

First, the relationship between the reference voltage Vref and the capacitance elements C1 to C3 (12P to 15P, 12N to 15N) was already represented by Equation (3). A relationship between the common voltage Vcm of the inputs of the buffer circuits 17P and 17N and the capacitance elements C1 to C3 is as represented by Equation (4), and a relationship of the capacitance elements C1 and C3, the reference voltage Vref, and the common voltage Vcm of the inputs of the buffer circuits 17P and 17N is as represented by Equation (5). In addition, a relationship between the capacitance elements C2 and C3, the reference voltage Vref, and the common voltage Vcm of the inputs of the buffer circuits 17P and 17N is as represented by Equation (6).

$$Vcm = \frac{C1 + C3}{C1 + C2 + 2C3} \cdot Vdd \quad (4)$$

$$\frac{C1}{C3} = \frac{2 \, Vcm}{Vref} - 1 \quad (5)$$

$$\frac{C2}{C3} = \frac{2 \, Vdd}{Vref} - \frac{2 \, Vcm}{Vref} - 1 \quad (6)$$

By setting the common voltage Vcm of the inputs of the buffer circuits 17P and 17N, the reference voltage Vref, and the power source voltage Vdd, it is possible to set the capacity ratio of the capacitance elements C1 to C3 that are included in the capacitance circuit by using the aforementioned Equations (5) and (6).

According to the first embodiment, the complete differential sampling is performed on the capacitance elements that are included in the capacitance circuit in the sampling period. In doing so, it is possible to downsize the capacitance elements while maintaining the amount of electric charge to be accumulated by the sampling and to suppress an increase in the occupation area of the multiplying digital-to-analog conversion circuit. As a result, it is possible to suppress an increase in the occupation area of the cyclic-type analog-to-digital converter using the multiplying digital-to-analog conversion circuit. Furthermore, it is possible to use the power source voltage Vdd and the ground voltage Vs as voltages to be supplied to the capacitance circuit in the residual error amplification period without using a highly precise reference voltage, and to thereby eliminate necessity of providing the reference voltage generation circuit for generating the highly precise reference voltage, and to suppress an increase in power consumption. In addition, since the multiplying digital-to-analog conversion circuit is configured of a capacitance circuit as a passive circuit, it is possible to suppress an increase in power consumption by the multiplying digital-to-analog conversion circuit.

Furthermore, according to the first embodiment, it is possible to prevent the electric charge that is accumulated in the capacitance circuit from breaking by buffering the output from the capacitance circuit by the buffer circuit, and to thereby further suppress an increase in the occupation area of the cyclic-type analog-to-digital converter.

Second Embodiment

Figure 2:
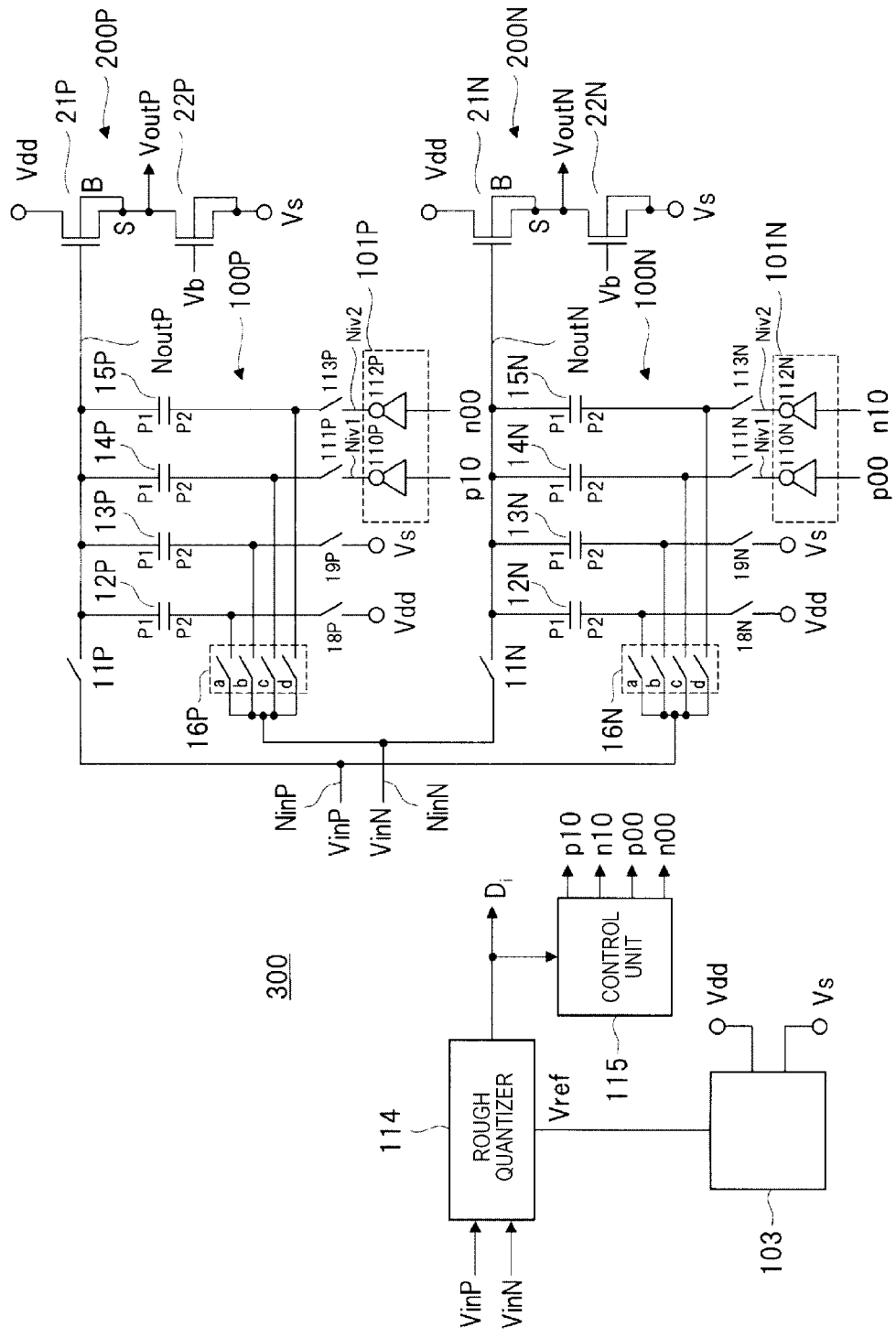
FIG. 2 is a circuit diagram illustrating a configuration of a multiplying digital-to-analog conversion circuit according to a second embodiment.

FIG. 2 is a circuit diagram illustrating a configuration of the multiplying digital-to-analog conversion circuit 300 and the buffer circuit according to a second embodiment. The MDAC 300 illustrated in FIG. 2 has a similar configuration to that of the MDAC 300 illustrated in FIG. 1. Therefore, parts different from those in the first embodiment will be mainly described, and descriptions of the configuration and the operations of the MDAC 300 will be omitted.

The first embodiment and the second embodiment are different mainly in that different buffer circuits are connected to the output node Nout (NoutP, NoutN) of the MDAC 300 in the first embodiment and the second embodiment. In the second embodiment, each of the buffer circuits 17P and 17N that are used in the first embodiment is configured of a source follower circuit. That is, a source follower circuit 200P is used instead of the buffer circuit 17P, and a source follower circuit 200N is used instead of the buffer circuit 17N.

The source follower circuit 200P that is connected to the output node NoutP of the capacitance circuit 100P that performs the sampling and residual error amplification of the normal phase input signal VinP includes a field-effect transistor for an input (hereinafter, referred to as a MOSFET) 21P and a MOSFET 22P for a current source. Similarly, the source follower circuit 200N that is connected to the output node NoutN of the capacitance circuit 100N that performs the sampling and the residual error amplification of the opposite phase input signal VinN includes a MOSFET 21N for an input and a MOSFET 22N for a current source. The MOSFET 21P, 22P, 21N, and 22N are N-channel MOSFETs in this embodiment. In addition, the MDAC 300 illustrated in FIG. 2 is formed on a single semiconductor device by a known semiconductor fabrication process although not particularly limited.

The MOSFET 21P for an input in the source follower circuit 200P has a gate electrode connected to the corresponding output node NoutP, a drain connected to the power source voltage Vdd, and a source S connected to a drain of the MOSFET 22P for a current source. A source of the MOSFET 22P for a current source is connected to the ground voltage Vs, and a predetermined bias voltage Vb is supplied to the gate thereof. The output signal VoutP of the source follower circuit 200P is extracted from the source S of the MOSFET 21P for an input. In addition, the back gates B of the MOSFET 21P for an input and the MOSFET 22P for a current source are connected to the sources of the corresponding MOSFETs.

In the same manner as in the source follower circuit 200P, the MOSFET 21N for an input in the source follower circuit 200N has a gate electrode connected to the corresponding output node NoutN, a drain connected to the power source voltage Vdd, and a source S connected to a drain of the MOSFET 22N for a current source. The source of the MOSFET 22N for a current source is grounded to the ground voltage Vs, and a predetermined bias voltage Vb is supplied to the gate thereof. The output signal VoutN of the source follower circuit 200N is also extracted from the source S of the MOSFET 21N for an input. In addition, back gates B of the MOSFET 21N for an input and the MOSFET 22N for a current source are connected directly to the sources of the corresponding MOSFETs.

Gate widths of the MOSFETs 21P and 21N for inputs and current values of the MOSFETs 22P and 22N for current sources are adjusted such that transient response waveforms of the output signals VoutP and VoutN of the source follower circuits 200P and 200N are converged in the residual error amplification period. In such a case, the current values of the MOSFETs 22P and 22N for current sources can be adjusted by adjusting a value of the bias voltage Vb. By causing the waveforms of the respective output voltages to converge in the residual error amplification period as described above, it is possible to accelerate a timing at which the next sampling is started.

By connecting the back gate B of the MOSFET 21P (21N) for an input directly to the source S of the MOSFET 21P (21N) itself, a substrate bias effect is reduced in the MOSFET 21P (21N) for an input. In doing so, it is possible to cause a voltage gain of the source follower circuit 200P (200N) to approach one.

As described above, there is a case in which it is necessary to form a P-channel well for forming the MOSFET 21P (21N) for an input in a semiconductor substrate of the semiconductor device in order to connect the back gate to the source when an N-channel MOSFET is used as the MOSFET 21P (21N) for an input. Therefore, it is considered that the back gate B is connected to the ground voltage Vs instead of the source S. In such a case, the substrate bias effect occurs in the MOSFET 21P (21N) for an input, and the voltage gain of the source follower circuit 200P (200N) becomes less than one. However, since the influence can be complemented by a typically known digital correction technology, such implementation is also applicable, of course.

It is also considered that the source follower circuits 200P and 200N by using P-channel MOSFETs instead of the N-channel MOSFETs. The P-channel MOSFETs have a property of low noise though a response speed thereof is inferior to that of the N-channel MOSFET. If the P-channel MOSFETs are used as the MOSFETs for inputs, it is possible to form the MOSFETs for inputs over N-channel wells by using a known semiconductor fabrication process and to thereby directly connect the back gates to the sources thereof.

As illustrated in the second embodiment, it is possible to utilize low-power-consumption and high-speed transient response of the source follower circuits by using the source follower circuits 200P and 200N as the buffer circuits and to reduce power consumption and increase a speed of the cyclic-type analog-to-digital converter as a result. Since the gate and the source of the MOSFET 21P (21N) for an input are electrically isolated in the second embodiment, it is possible to prevent the electric charge held by the capacitance circuit from breaking due to electric charge dispersion.

In order to avoid complication of the drawing, the power source nodes Nvd and Nvs are omitted in FIG. 2.

Third Embodiment

Figure 4A:
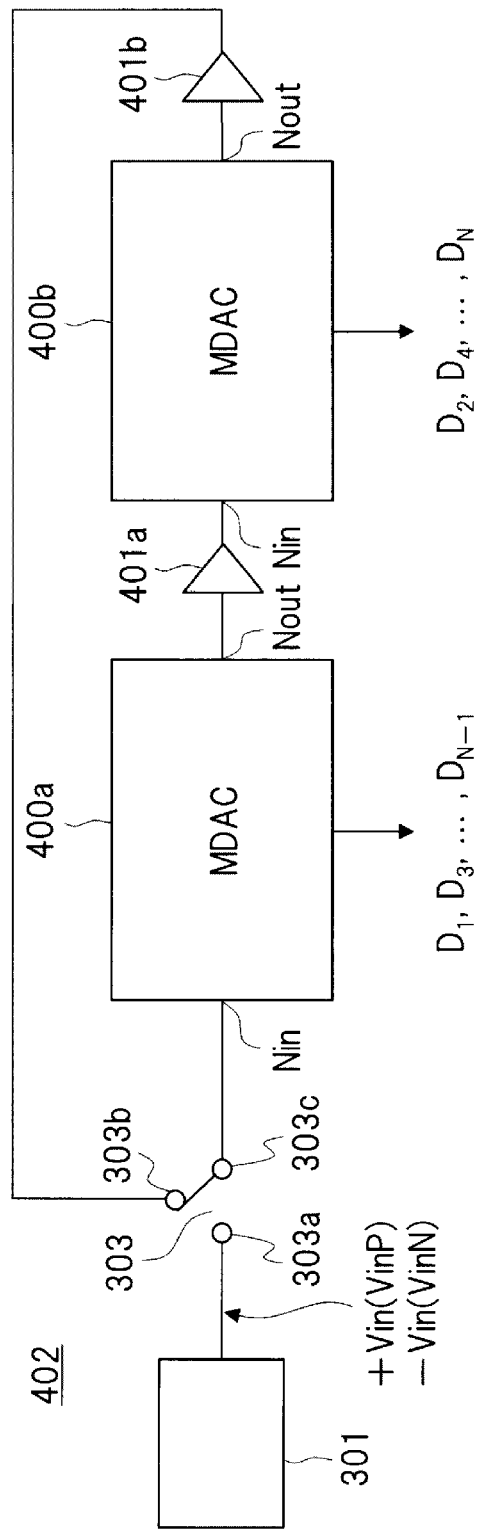
FIGS. 4A and 4B are a block diagram and a timing diagram illustrating a configuration of a cyclic-type analog-to-digital converter according to a third embodiment.
Figure 4B:
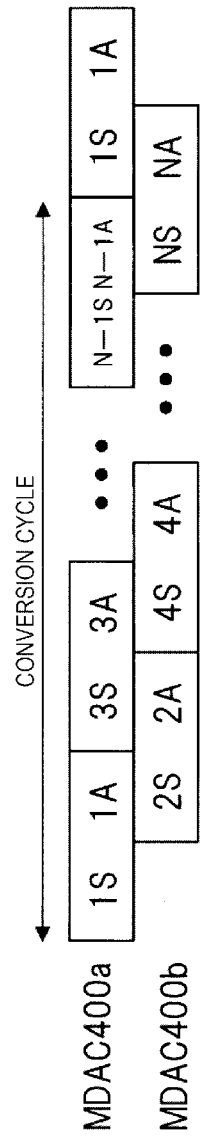

FIG. 4A is a block diagram illustrating a configuration of a cyclic-type analog-to-digital converter 402 according to a third embodiment. FIG. 4B is a timing diagram illustrating operations of the cyclic-type analog-to-digital converter 402.

In FIG. 4A, 400a and 400b represent multiplying digital-to-analog conversion circuits. As each of the multiplying digital-to-analog conversion circuits 400a and 400b, the MDAC 300 illustrated in FIG. 1 or 2 is used. In the drawing, 301 represents an analog circuit with the same configuration as that of the analog circuit schematically illustrated in FIGS. 3A and 3B. In addition, 303 also represents a switch with the same configuration as that of the switch illustrated in FIGS. 3A and 3B.

In the first embodiment described with reference to FIGS. 1 to 3B, the cyclic-type analog-to-digital converter is configured of the single MDAC 300. In contrast, two MDACs 400a and 400b that have the same configuration as that of the MDAC 300 illustrated in FIG. 1 or 2 and perform the same operation are connected in series to configure the cyclic-type analog-to-digital converter 402 in the third embodiment.

Since the configuration and the operations of the MDACs 400a and 400b are the same as MDAC 300 described in the first embodiment or the second embodiment, detailed descriptions thereof will be omitted herein.

An input node Nin of the MDAC 400a is connected to the switch 303. When input signals VinP and VinN as analog signals output from the analog circuit 301 are converted into digital signals, the switch 303 takes the input signals VinP and VinN to the input node Nin of the MDAC 400a. In a period during which the taken input signals VinP and VinN are converted into digital signals, the node 303c and the node 303b of the switch 303 are connected. In doing so, signals related to the input signals VinP and VinN circulate in a closed loop that is configured of the MDAC 400a, the buffer circuit 401a, the MDAC 400b, the buffer circuit 401b, and the switch 303 in the period which the taken input signals are converted into digital signals. That is, these circuits and the switch 303 are connected in series from the viewpoint of processing the signals related to the input signals VinP and VinN. Here, the buffer circuits 401a and 401b are the buffer circuits or the source follower circuits illustrated in FIGS. 1 and 2.

FIG. 4B illustrates operation timings of the MDACs 400a and 400b. In FIG. 4B, the operation timing of the MDAC 400a is illustrated on the upper side, and the operation timing of the MDAC 400b is illustrated on the lower side. The respective MDAC 400a and 400b perform operations in the sampling period and the following residual error amplification period as described with reference to FIGS. 1, 3A, and 3B. That is, the operations of the rough quantization and the complete differential sampling are performed in the sampling period, and the residual error amplification operation is performed in the residual error amplification period.

First, the MDAC 400a performs the complete differential sampling on the input signals VinP and VinN in the sampling period 1S through the switch 303 and performs the rough quantization in this period. In the residual error amplification period 1A following the sampling period 1S, the MDAC 400a performs the residual error amplification operation. The amplified residual error is delivered from the output node Nout to the input node Nin of the MDAC 400b via the buffer 401a. In the residual error amplification period 1A, the output from the MDAC 400a is delivered to the input node Nin of the MDAC 400b via the buffer circuit 401a. Therefore, the MDAC 400b starts the sampling period 2S so as to overlap the residual error amplification period 1A of the MDAC 400a. The MDAC 400b performs the complete differential sampling and the rough quantization in the sampling period 2S and performs the residual error amplification in the following residual error amplification period 2A. The output from the MDAC 400b is delivered to the input node Nin of the MDAC 400a via the buffer circuit 401b and the switch 303 from the residual error amplification period 2A. In doing so, the residual error amplification period 2A of the MDAC 400b overlaps the sampling period 3S of the MDAC 400a. Thereafter, the processing is performed such that the sampling period overlaps the residual error period until N-bit digital signals are obtained. That is, the processing is executed in a pipeline manner. In doing so, odd number bits from the uppermost-order bit in the converted digital signals are converted by the MDAC 400a, even number bits are converted by the MDAC 400b. According to the embodiment, there is an advantage that the conversion rate can be double by causing two multiplying digital-to-analog conversion circuits to operate.

In addition, the input nodes Nin and the output nodes Nout between the two MDAC 400a and 400b are electrically isolated by the buffer circuits 401a and 401b. For example, the output node Nout of the MDAC 400a and the input node Nin of the MDAC 400b are electrically isolated by the buffer circuit 401a. In doing so, it is possible to prevent occurrence of electric charge dispersion between the capacitance circuit of the MDAC 400a and the capacitance circuit of the MDAC 400b even if the residual error amplification period overlaps the sampling period. Electric charge dispersion of the electric charge held in the capacitance circuit of the MDAC 400a with the capacitance circuit of the MDAC 400b does not occur even if the residual error amplification period 1A overlaps the sapling period 2S, for example. In doing so, it is possible for the MDAC 400a to maintain a correct voltage during the residual error amplification period 1A and to thereby suppress degradation in the precision and to enhance the conversion rate.

Fourth Embodiment

Figure 5:
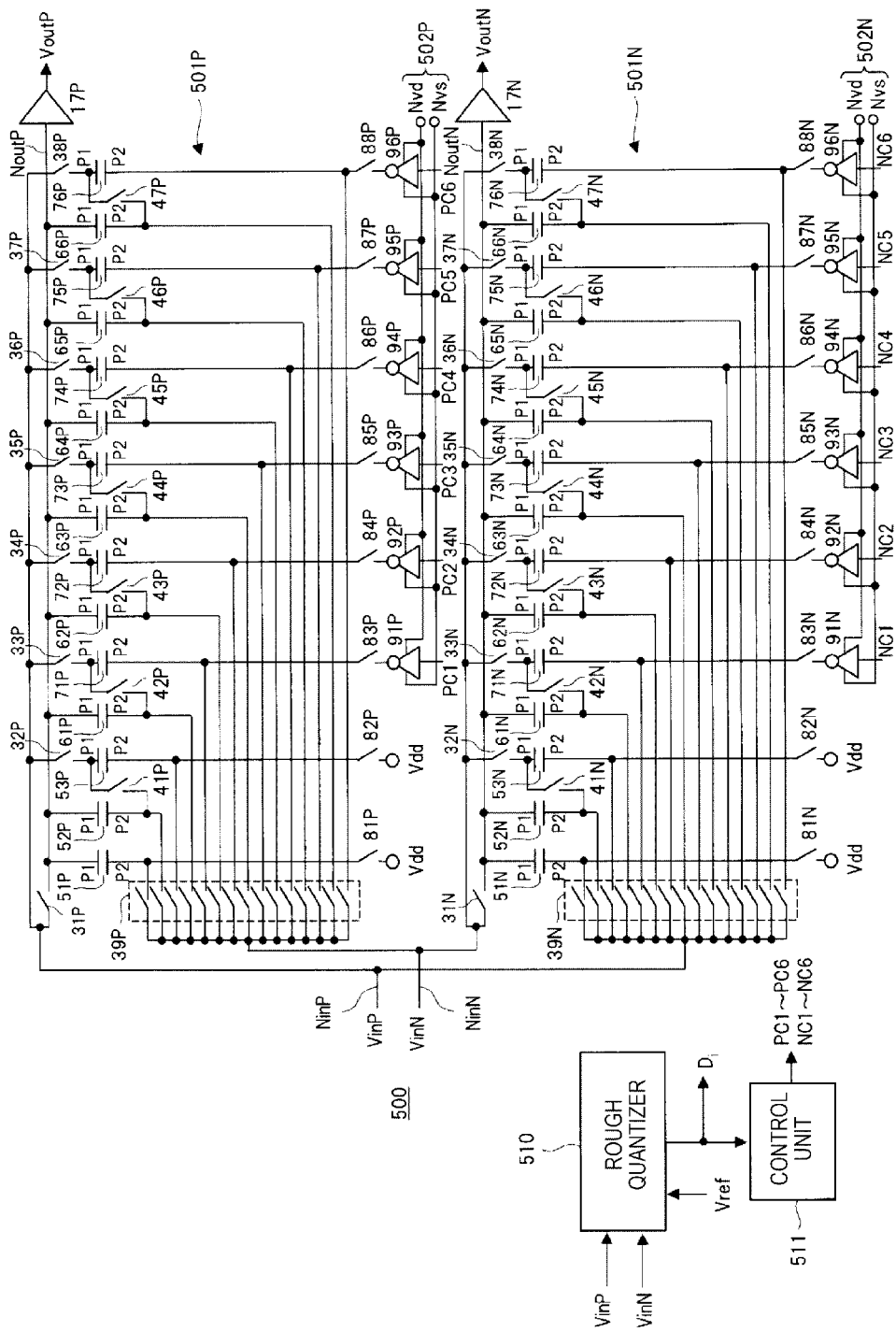
FIG. 5 is a circuit diagram illustrating a configuration of a multiplying digital-to-analog conversion circuit according to a fourth embodiment.

FIG. 5 is a circuit diagram illustrating a configuration of a multiplying digital-to-analog conversion circuit 500 according to a fourth embodiment. According to the fourth embodiment, a multiplying digital-to-analog conversion circuit that exhibits a higher residual error amplification rate G as compared with that of the MDAC 300 described above in the first or second embodiment is provided. Although the residual error amplification rate G was substantially doubled in the first or second embodiment, a multiplying digital-to-analog conversion circuit with a substantially quadrupled residual error amplification rate G is provided in the fourth embodiment. The MDAC 500 illustrated in FIG. 5 is used in the cyclic-type analog-to-digital converter illustrated in FIGS. 3A and 3B or 4A and 4B. That is, the MDAC 500 is used as the MDAC 300 in the case of FIGS. 3A and 3B, and is used as the MDACs 401a and 401b in the case of FIGS. 4A and 4B.

In FIG. 5, the MDAC 500 includes a rough quantizer 510 that roughly quantizes the normal phase input signal VinP and the opposite phase input signal VinN and a control unit 511 that generates control signals PC1 to PC6 and NC1 to NC6 in accordance with outputs from the rough quantizer 510. Furthermore, the MDAC 500 includes capacitance circuits 501P and 501N that samples and amplifies the normal phase input signal VinP and the opposite phase input signal VinN and voltage supply units 502P and 502N that determines voltages to be supplied to the capacitance circuits 501P and 501N based on the control signals PC1 to PC6 and NC1 to NC6 from the control unit 511. Although not particularly limited, the inputs of the buffer circuits 17P and 17N are connected to the output nodes NoutP and NoutN of the MDAC 500 in the fourth embodiment. FIG. 5 illustrates these buffer circuits 17P and 17N along with the MDAC 500.

Since the capacitance circuits 501P and 501N have the same configuration, a detailed description will be given of the capacitance circuit 501P first. The capacitance circuit 501P includes two capacitance banks in order to obtain double or greater residual error amplification rate G (substantially quadrupled residual error amplification rate G in the case of this embodiment). Although not expressly illustrated in the drawing in order to avoid complication, a description will be given on the assumption that one of the two capacitance banks is a first capacitance bank BK1 and the other capacitance bank is a second capacitance bank BK2.

The first capacitance bank BK1 includes a plurality of capacitance elements with first electrodes P1 connected to the output node NoutP, and the second capacitance bank BK2 includes a plurality of capacitance elements with first electrodes P1 connected to the second electrodes P2 of the corresponding capacitance elements in the first capacitance bank BK1 via switches. A description will be given with reference to FIG. 5. The first capacitance bank BK1 includes capacitance elements 52P, 61P, 62P, 63P, 64P, 65P, and 66P with the first electrodes P1 connected to the output node NoutP. In addition, the second capacitance bank BK2 includes capacitance elements 53P, 71P, 72P, 73P, 74P, 75P, and 76p with the first electrodes P1 connected to the second electrodes P2 of the corresponding capacitance elements 52P, 61P, 62P, 63P, 64P, 65P, and 66P via switches 41P, 42P, 43P, 44P, 45P, 46P, and 47P.

The first electrodes P1 of the capacitance elements 52P, 61P, 62P, 63P, 64P, 65P, and 66P that are included in the first capacitance bank BK1 are connected to the input node NinP via the switch 31P, and the second electrodes P2 of the capacitance elements 52P, 61P, 62P, 63P, 64P, 65P, and 66P are connected to the input node NinN via the switch array 39P that is configured of a plurality of switch groups. In addition, the second electrodes P2 of the capacitance elements 53P, 71P, 72P, 73P, 74P, 75P, and 76P that are included in the second capacitance bank BK2 are connected to the aforementioned switch array 39P that is configured of a plurality of switch groups. As can be understood from the drawing, the second electrodes P2 of the capacitance elements that are included in the first capacitance bank BK1 and the second electrodes of the capacitance elements that are included in the second capacitance bank BK2 are connected to the input node NinN via mutually different switches in the switch groups included in the switch array 39.

In addition, the first electrodes of the capacitance elements 53P, 71P, 72P, 73P, 74P, 74P, 75P, and 76P that are included in the second capacitance bank BK2 are connected to the input node NinP via the switches 32P, 33P, 34P, 35P, 36P, 37P, and 38P. Furthermore, the second electrode P2 of the capacitance element 53P in the second capacitance bank BK2 is connected to the power source voltage Vdd via a switch 82P, and the second electrodes P2 of the capacitance elements 71P, 72P, 73P, 74P, 75P, and 76P are connected to an output of the voltage supply unit 502P via the switches 83P, 84P, 85P, 86P, 87P, and 88P.

Furthermore, the capacitance circuit 501P includes a capacitance element 51P that includes a first electrode P1 connected to the output node NoutP and a second electrode P2 connected to the input node NinN via a switch in the switch array 39P and connected to the power source voltage Vdd via the switch 81P.

The voltage supply unit 501P includes a plurality of inverter circuits 91P, 92P, 93P, 94P, 95P, and 96P in the fourth embodiment, and the respective inverter circuits are connected to the power source nodes Nvd and Nvs and operate by using, as operation voltages, the power source voltage Vdd and the ground voltage Vs that are supplied from the power source nodes Nvd and Nvs. That is, the respective inverter circuits 91P to 96P operate by the common power source voltage.

The control signals PC1 to PC6 from the control unit 511 are input to the inverter circuits 91P to 96P. In doing so, the inverter circuit 91P supplies an inverted voltage of the voltage of the control signal PC1 to the switch 83P. In such a case, the inverter circuit 91P supplies the power source voltage Vdd or Vs, which is supplied to the power source node Nvd or Nvs, to the switch 83P. Similarly, the inverter circuit 92P supplies a voltage of an inverted signal of the control signal PC2 to the switch 84P, and the inverter circuit 93P supplies an inverted signal of the control signal PC3 to the switch 85P. In addition, the inverter circuit 94P supplies a voltage of an inverted signal of the control signal PC4 to the switch 86P, the inverter circuit 95P supplies a voltage of an inverted signal of the control signal PC5 to the switch 87P, and the inverter circuit 96P supplies a voltage of an inverted signal of the control signal PC6 to the switch 88P.

In the same manner as in the first or second embodiment, the normal phase input signal VinP is supplied to the input node NinP, and the opposite phase input signal VinN is supplied to the input node NinN. In the fourth embodiment, the input nodes NinP and NinN are input nodes of the MDAC 500 and also function as input nodes of the capacitance circuits 501P and 501N. In addition, the output node NoutP is an output node of the MDAC 500 and also functions as an output node of the capacitance circuit 501P, and the output node Nout N is an output node of the MDAC 500, and also functions as an output node of the capacitance circuit 501N.

The output nodes NoutP and NoutN are connected to the inputs of the buffer circuits 17P and 17N. The buffer circuits 17P and 17N correspond to the buffer circuit 302 in FIGS. 3A and 3B, and correspond to the buffer circuit 401a or 401b in FIGS. 4A and 4B. By supplying the normal phase input signal VinP to the input node NinP and supplying the opposite phase input signal VinN to the input node NinN, a residual error amplified signal obtained by amplifying a residual error in accordance with the normal phase input signal VinP is output from the output node NoutP, and a residual error amplified signal in accordance with the opposite phase input signal VinN is output from the output node NoutN. In doing so, a differential signal of the residual error amplified signals is output between the output nodes NoutP and NoutN. The differential signal is supplied to the switch 303 via the buffer circuits 17P and 17N (corresponding to 302 in FIGS. 3A and 3B, for example). Thereafter, the differential signal is fed back to the input nodes NinP and NinN of the MDAC 500 in the example illustrated in FIGS. 3A and 3B.

The second capacitance circuit 501N also includes the first capacitance bank BK1 and the second capacitance bank BK2 in the same manner as the first capacitance circuit 501P though not shown in the drawing. The first capacitance bank BK1 includes capacitance elements 52N and 61N to 66N with the first electrodes connected to the output node NoutN, and the second capacitance bank BK2 include capacitance elements 53N and 71N to 76N connected to the second electrodes P2 of the capacitance elements 52N and 61N to 66N via the switches 41N to 47N. The second electrodes P2 of the capacitance elements 52N and 61N to 66N in the first capacitance bank BK1 are connected to the input node NinP via the switch array 39N that is configured of a plurality of switch groups. In addition, the first electrode P1 of the capacitance elements 53N and 71N to 76N in the second capacitance bank BK2 are connected to the input node NinN via the switches 32N to 38N. Furthermore, the second electrodes P2 of the capacitance elements 53N and 71N to 76N are connected to the input node NinP via the switch array 39N, and the second electrode P2 of the capacitance element 53N is connected to the power source voltage Vdd via the switch 82N, and the second electrodes P2 of the capacitance elements 71N to 76N are connected to the output of the voltage supply unit 501N via the switches 83N to 88N.

In addition, the capacitance circuit 501N has a first electrode P1 connected to the output node NoutN and a second electrode P2 connected to the input node NinP via the switch array 39N, and further includes a capacitance element 51N connected to the power source voltage Vdd via the switch 81N.

The voltage supply unit 501N includes a plurality of inverter circuits 91N to 96N in the same manner as the voltage supply unit 501P, and operation power sources thereof are commonly supplied from the power source nodes Nvd and Nvs. The control signals NC1 to NC6 from the control unit 511 are supplied to the inverter circuits 91N to 96N, and in the inverter circuit 91N to 96N, the inverted voltages of those of the control signals NC1 to NC6 are supplied to the switches 83N to 88N. The voltages supplied to the respective switches 83N to 88N by the inverter circuits 91N to 96N are voltages corresponding to the power source voltage or the ground voltage supplied to the power source nodes Nvd and Nvs.

In the fourth embodiment, a capacitance value of each of the aforementioned capacitance elements 51P and 51N is assumed to be C1, and a capacitance value of each of the capacitance elements 52P, 52N, 53P, and 53N is assumed to be C2. In Addition, a capacitance value of each of the capacitance elements 61P to 66P and 61N to 66N that are included in the first capacitance bank BK1 is assumed to be C3, and a capacitance value of each of the capacitance elements 71P to 76P and 71N to 76N that are included in the second capacitance bank BK2 is also assumed to be C3.

Next, a description will be given of operations of the MDAC 500 according to the fourth embodiment.

In the same manner as in the first or second embodiment, the MDAC 500 also operates differently in the sampling period and in the residual error amplification period.

In the sampling period, the switches 31P to 38P and 31N to 38N and switch arrays 39P and 39N are brought into the ON state, and the other switches 41P to 47P, 41N to 47N, 81P to 88P, and 81N to 88N are brought into the OFF state. In doing so, the normal phase input signal VinP is supplied to the first electrodes P1 of the capacitance elements 52P and 61P to 66P in the first capacitance bank BK1 in the capacitance circuit 501P and of the capacitance elements 53P and 71P to 76P in the second capacitance bank BK2 in the capacitance circuit 501P, and the opposite phase input signal VinN is supplied to the second electrodes P2 thereof. In addition, the normal phase input signal VinP is also supplied to the first electrode P1 of the capacitance element 51P in the capacitance circuit 501P, and the opposite phase input signal VinN is supplied to the second electrode P2. That is, the normal phase input signal VinP and the opposite phase input signal VinN are applied to the pair of electrodes P1 and P2 in each capacitance element, and the complete differential sampling is performed.

In contrast, the opposite phase input signal VinN is supplied to the first electrodes of the capacitance elements 52N and 61N to 66N in the first capacitance bank BK1 and of the capacitance elements 53N and 71N to 76N in the second capacitance bank BK2 in the capacitance circuit 501N, and the normal phase input signal VinP is supplied to the second electrodes P2 thereof. At this time, the opposite phase input signal VinN is supplied to the first electrode P1 of the capacitance element 51N in the capacitance circuit 501N, and the normal phase input signal VinP is supplied to the second electrode P2 thereof. That is, the opposite phase input signal VinN and the normal phase input signal VinP are applied to the pair of electrodes P1 and P2 in each capacitance element, and the complete differential sampling is performed. As a result, it is possible to maintain the amount of hold electric charge even if the capacitance value of each capacitance element is reduced, and to thereby prevent an increase in the occupation area.

In the same manner as in the first and second embodiments, the normal phase input signal VinP is supplied to the first electrodes P1 of the capacitance elements 51P, 52P, and 61P to 66P with the first electrodes P1 connected to the output node NoutP in the capacitance circuit 501P, in the sampling period. In contrast, the opposite phase input signal VinN is supplied to the first electrodes P1 of the capacitance elements 51N, 52N, and 61N to 66N with the first electrodes P1 connected to the output node NoutN in the capacitance circuit 501N, in the sampling period. In doing so, the capacitance circuit 501P outputs a residual error amplified signal related to the normal phase input signal VinP to the output node NoutP, and the capacitance circuit 501N outputs a residual error amplified signal related to the opposite phase input signal VinN to the output node NoutN.

In the sampling period, the normal phase input signal VinP and the opposite phase input signal VinN that are supplied to the input nodes NinP and NinN are roughly quantized by the rough quantizer 510. Although FIG. 5 illustrates the input nodes VinP and VinN and the input of the rough quantizer 510 so as to be separate from each other, it should be understood that the input of the rough quantizer 510 is coupled to the input nodes NinP and NinN.

Although the quantization by the rough quantizer 510 is significantly similar to the quantization by the rough quantizer 114 as described above in the first embodiment, septenary quantization is performed in the fourth embodiment.

That is, according to the first embodiment, it is determined whether the differential voltage between the normal phase input signal VinP and the opposite phase input signal VinN (VinP−VinN) (a) is greater than the reference voltage Vref/4, (b) is in a range from the reference voltage Vref/4 to the reference voltage −Vref/4, or (c) is smaller than the reference voltage −Vref/4, and the input signal is quantized.

In contrast, according to the fourth embodiment, the rough quantizer 510 determines which of the following voltage ranges the differential voltage of the input differential signal (VinP−VinN) is present in, and then performs the quantization. That is, it is determined whether the differential voltage (VinP−VinN) (a1) is equal to or greater than 5Vref/8, (a2) is in a range from 5Vref/8 to 3Vref/8, (a3) is in a range from 3Vref/8 to Vref/8, (b) is in a range from Vref/8 to −Vref/8, (c3) is in a range from −Vref/8 to −3Vref/8, (c2) is in a range from −3Vref/8 to −5Vref/8, or (C1) is equal to or less than −5Vref/8.

If it is determined that the differential voltage is (a1), the rough quantizer 510 sets the value of the digital signal $D_i$ to be output to "3". If it is determined that the differential voltage is (a2), the rough quantizer 510 sets the value of the digital signal $D_i$ to be output to "2". If it is determined that the differential voltage is (a1), the rough quantizer 510 sets the value of the digital signal $D_i$ to be output to "1". In addition, if it is determined that the differential voltage is (b), the rough quantizer 510 sets the value of the digital signal $D_i$ to be output to "0". If it is determined that the differential voltage is (c3), the rough quantizer 510 sets the value of the digital signal $D_i$ to be output to "−1". If it is determined that the differential voltage is (c2), the rough quantizer 510 sets the value of the digital signal $D_i$ to be output to "−2". If it is determined that the differential voltage is (c1), the rough quantizer 510 sets the value of the digital signal $D_i$ to be output to "−3". The digital signals $D_i$ that are obtained by such quantization are output from the cyclic-type analog-to-digital converter. By performing predetermined processing on the plurality of digital signals $D_i$ that are output from the rough quantizer 510 in a time-series manner, the signals are converted into binary digital signals. Furthermore, the digital signals $D_i$ as outputs from the rough quantizer 510 are supplied to the control unit 511.

In the residual error amplification period following the sampling period, the switches 31P to 38P and 31N to 38N and the switch arrays 39P and 39N are brought into the OFF state. In contrast, the switches 41P to 47P and 81P to 88P and switches 41N to 47 and 81N to 88N are brought into the ON state. In doing so, the first electrodes P1 of the capacitance elements 53P and 71P to 76P in the second capacitance bank BK2 are connected to the second electrodes P2 of the capacitance elements 52P and 61P to 66P in the first capacitance bank BK1 in the capacitance circuit 501P. That is, the capacitance elements in the first capacitance bank and the capacitance elements in the second capacitance bank BK2 are connected in series. Similarly, the first electrodes P1 of the capacitance elements 53N and 71N to 76N in the second capacitance bank BK2 are connected to the second electrodes P2 of the capacitance elements 52N and 61N to 66N in the first capacitance bank BK1 in the capacitance circuit 501N. In doing so, the capacitance elements in the first capacitance bank BK1 and the capacitance elements in the second capacitance bank BK2 are connected in series in the capacitance circuit 501N.

A description will be given of an example of the capacitance elements connected in series in the residual error amplification period. In the capacitance circuit 501P, the second electrode P2 of the capacitance element 52P is connected to the first electrode P1 of the capacitance element 53P, and the second electrode P2 of the capacitance element 66P is connected to the first electrode P1 of the capacitance element 76P. Similarly, in the capacitance circuit 501N, the second electrode P2 of the capacitance element 52N is connected to the first electrode P1 of the capacitance element 53N, and the second electrode P2 of the capacitance element 66N is connected to the first electrode P1 of the capacitance element 76N.

Since the switches 81P, 82P, 81N, and 82N are brought into the ON state in the residual error amplification period, the capacitance element 51P in the capacitance circuit 501P is connected between the power source voltage Vdd and the output node NoutP. In addition, the capacitance elements 52P and 53P in the capacitance circuit 501P are connected between the power source voltage Vdd and the output node NoutP in series. Similarly, the capacitance element 51N in the capacitance circuit 501N is connected between the power source voltage Vdd and the output node NoutN. In addition, the capacitance elements 52N and 53N in the capacitance circuit 501N are connected between the power source voltage Vdd and the output node NoutN in series.

The capacitance elements 51P to 53P (51N to 53N) are used in order to appropriately set the common voltage Vcm at the output node NoutP (NoutN). It is desirable that the common voltage Vcm is set in consideration of an operation point of the buffer circuit 17P (17N). The capacitance elements 12P, 13P, 12N, and 13N described above in the first and second embodiments are also used in order to appropriately set the common voltage Vcm. In addition, various methods of adjusting the common voltage Vcm can be considered as well as the configuration and the method illustrated in FIG. 5, and it is a matter of course that the present invention is effective if any of the methods is employed.

Since the switches 83P to 88P and 83N to 88N are brought into the ON state in the residual error amplification period, the voltage from the voltage supply unit 502P is supplied to the second electrodes P2 of the capacitance elements 71P to 76P in the second capacitance bank BK2 via the switches 83P to 88P. Similarly, the voltage from the voltage supply unit 502 is supplied to the second electrodes P2 of the capacitance elements 71N to 76N in the second capacitance bank BK2 via the switches 83N to 88N. In the fourth embodiment, the output voltages form the inverter circuits 91P to 96P are applied to the second electrodes P2 of the corresponding capacitance elements 71P to 76P, and the output voltages from the inverter circuits 91N to 96N are applied to the second electrodes P2 of the corresponding capacitance elements 71N to 76n. Here, each inverter circuit applies the power source voltage Vdd supplied to the power source node Nvd or the ground voltage Vs supplied to the power source node Nvs in accordance with the supplied control signals PC1 to PC6 and PN1 to PN6 as an output voltage to the second electrode P2 of the corresponding capacitance element.

In the residual error amplification period, the control unit 511 generates the control signals PC1 to PC6 and NC1 to NC6 in accordance with the digital signals $D_i$ output from the rough quantizer 510. In the fourth embodiment, the control unit 511 generates the control signals PC1 to PC6 so as to apply, as an output voltage, the ground voltage Vs (ground) from the inverter circuits 91P to 96P to the second electrodes P2 of the six capacitance elements 71P to 76P in the second capacitance bank BK2 in the capacitance circuit 501P on the normal phase side when the digital signal $D_i$ is "3" (a1). At this time, the control unit 511 generates control signals NC1 to NC6 so as to apply, an output voltage, of the power source voltage Vdd from the inverter circuits 91N to 96N to the second electrodes P2 of the six capacitance elements 71N to 76N in the second capacitance bank BK2 in the capacitance circuit 501N on the opposite phase side.

When the digital signal $D_i$ is "2" (a2), the control unit 511 generates the control signals PC1 to PC6 so as to apply an output of the ground voltage Vs from the inverter circuits to the second electrodes P2 of five capacitance elements from among the capacitance elements 71P to 76P in the second capacitance bank BK2 in the capacitance circuit 501P and apply an output of the power source voltage Vdd from the inverter circuit to the second electrode P2 of the remaining one capacitance element. At this time, the control unit 511 generates the control signals NC1 to NC6 so as to apply an output of the power source voltage Vdd from the inverter circuits to the second electrodes P2 of five capacitance elements from among the capacitance elements 71N to 76N in the second capacitance bank BK2 in the capacitance circuit 501N and apply an output of the ground voltage Vs from the inverter circuit to the second electrode P2 of the remaining one capacitance element.

When the digital signal $D_i$ is "1" (a3), the control unit 511 generates the control signals PC1 to PC6 so as to apply an output of the ground voltage Vs from the inverter circuits to the second electrodes P2 of four capacitance elements from among the capacitance elements 71P to 76P in the second capacitance bank BK2 in the capacitance circuit 501P and apply an output of the power source voltage Vdd from the inverter circuit to the second electrodes P2 of the remaining two capacitance elements. At this time, the control unit 511 generates the control signals NC1 to NC6 so as to apply an output of the power source voltage Vdd to the second electrodes P2 of four capacitance elements from among the capacitance elements 71N to 76N in the second capacitance bank BK2 in the capacitance circuit 501N and apply an output of the ground voltage Vs to the second electrode P2 of the remaining two capacitance elements.

When the digital signal $D_i$=0 (b), the control unit 511 generates the control signals PC1 to PC6 so as to apply an output of the ground voltage Vs from the inverter circuits to the second electrodes P2 of three capacitance elements from among the capacitance elements 71P to 76P in the second capacitance bank BK2 in the capacitance circuit 501P and apply an output of the power source voltage Vdd to the second electrodes P2 of the remaining three capacitance elements. At this time, the control unit 511 generates the control signals NC1 to NC6 so as to apply an output of the power source voltage Vdd from the inverter circuits to the second electrodes P2 of three capacitance elements from among the capacitance elements 71N to 76N in the second capacitance banks BK2 in the capacitance circuit 501N and apply an output of the ground voltage Vs from the inverter circuit to the second electrodes P2 of the remaining three capacitance elements.

When the digital signal $D_i$ is "−1" (c3), the control unit 511 generates the control signals PC1 to PC6 so as to apply an output of the ground voltage Vs from the inverter circuits to the second electrodes P2 of two capacitance elements from among the capacitance elements 71P to 76P in the second capacitance bank BK2 in the capacitance circuit 501P and apply an output of the power source voltage Vdd from the inverter circuit to the second electrodes P2 of the remaining four capacitance elements. At this time, the control unit 511 generates the control signals NC1 to NC6 so as to apply an output of the power source voltage Vdd from the inverter circuits to the second electrodes P2 of two capacitance elements from among the capacitance elements 71N to 76N in the second capacitance bank BK2 in the capacitance circuit 501N and apply an output of the ground voltage Vs from the inverter circuit to the second electrodes P2 of the remaining four capacitance elements.

When the digital signal $D_i$ is "−2" (c2), the control unit 511 generates the control signals PC1 to PC6 so as to apply an output of the ground voltage Vs from the inverter circuits to the second electrode P2 of a single capacitance element from among the capacitance elements 71P to 76P in the second capacitance bank BK2 in the capacitance circuit 501P and apply an output of the power source voltage Vdd from the inverter circuit to the second electrodes P2 of the remaining five capacitance elements. At this time, the control unit 511 generates the control signals NC1 to NC6 so as to apply an output of the power source voltage Vdd from the inverter circuit to the second electrode P2 of a single capacitance element from among the capacitance elements 71N to 76N in the second capacitance bank BK2 in the capacitance circuit 501N and apply an output of the ground voltage Vs from the inverter circuit to the second electrodes P2 of the remaining five capacitance elements.

Finally, when the digital signal $D_i$ is "−3" (c1), the control unit 511 generates the control signals PC1 to PC6 so as to apply an output of the power source voltage Vdd from the inverter circuits to the second electrodes P2 of all the capacitance elements 71P to 76P in the second capacitance bank BK2 in the capacitance circuit 501P. At this time, the control unit 511 generates the control signals NC1 to NC6 so as to apply an output of the ground voltage Vs from the inverter circuits to the second electrodes P2 of all the capacitance elements 71N to 76N in the second capacitance bank BK2 in the capacitance circuit 501N.

According to the fourth embodiment, the capacitance elements 61P to 66P (61N to 66N) in the first capacitance bank BK1 and the capacitance elements 71P to 76P (71N to 76N) in the second capacitance bank BK2 in the capacitance circuit 501P (501N) are charged in parallel by the complete differential sampling in the sampling period. In the residual error amplification period following the sampling period, the capacitance elements 61P to 66P (61N to 66N) in the first capacitance bank BK1 and the capacitance elements 71P to 76P (71N to 76N) in the second capacitance bank BK2 that are respectively charged are connected in series. In doing so, it is possible to cause the voltage at the output node NoutP (NoutN) to be double or greater. In addition, the output from the rough quantizer is provided to the capacitance circuits by the voltage supply circuits and is reflected to the voltage at the output node NoutP (NoutN).

By the aforementioned operations, the differential voltage Vout between the output voltage VoutP of the buffer circuit 17P and the output voltage VoutN of the buffer circuit 17N, that is, the output voltage Vout of the MDAC 500 is based on Equation (7). Here, the gain G of the MDAC is a value that is close to four. In addition, Vin is a differential voltage between the normal phase input signal VinP and the opposite phase input signal VinN, and Vref is represented by Vdd and each capacity ratio in the same manner as in Equation (3).

$$Vout = G\left(Vin - \frac{1}{4}D_i \cdot Vref\right) \quad (7)$$

In the fourth embodiment, the capacitances used for sampling are configured of a plurality of capacitance elements, and the output from the rough quantizer 510 is reflected by applying the power source voltage Vdd or the ground voltage Vs to the second electrodes P2 of the capacitance elements in the residual error amplification period in the same manner as in the first embodiment. At this time, the reference voltage Vref is equivalently set in accordance with the capacity ratio of the plurality of capacitance elements that are used for the sampling. From another viewpoint, the reference voltage Vref is equivalently set by performing voltage division of the voltage difference between the power source voltage Vdd and the ground voltage Vs in accordance with the capacity ratio and further realizing the voltage division in the differential circuit configuration of performing complementary operations. In doing so, it becomes only necessary for the power supply units 502P and 502N to apply the power source voltage Vdd or the ground voltage Vs to the plurality of capacitance elements that are used for the sampling in the residual error amplification period, it is not necessary to separately provide a high-precision reference voltage generation circuit, and it is possible to reduce power consumption. In addition, since the complete differential sampling is performed, it is possible to reduce the capacitance values of the capacitance elements that are used for the sampling to ¼ and to thereby suppress an increase in the occupation area.

Furthermore, since the first capacitance bank BK1 and the second capacitance bank BK2 are connected in series in the residual error amplification period in the fourth embodiment, it is possible to substantially quadruple the voltage amplification rate G of the MDAC 500. In contrast, according to the first embodiment, it is possible to obtain a substantially double amplification rate of that of the aforementioned basic concept. In addition to this configuration, it is possible to further obtain a substantially double voltage amplification rate by connecting the first capacitance bank BK1 and the second capacitance bank BK2 in series. As a result, it is possible to obtain substantially a quadrupled (G≈4) residual error amplification rate in total. By increasing the amplification rate in the residual error amplification period, it is possible to reduce the number of times of conversion as can be understood from Equation (1). For example, the amplification rate G in the first embodiment is substantially two. In contrast, the amplification rate G in the fourth embodiment is substantially four. Therefore, the value of the denominator of the fraction in the last term in Equation (1) in the fourth embodiment becomes the same as the value in the first embodiment by performing the conversion half number of times N. Therefore, it is possible to realize the same conversion error by performing the conversion half number of times N as compared with the first embodiment (G=2).

Since only the half number of times N of conversion is required, it is possible to double the conversion processing time for each bit at the same conversion rate. As a result, it is possible to alleviate to double the transient response time of the buffer circuits 17P and 17N, to reduce power consumption of the buffer circuits, and to further reduce power consumed by the cyclic-type analog-to-digital converter. In contrast, since the number of elements such as switches and capacitance elements is smaller and the configurations are simpler in the first embodiment as compared with those in this embodiment, there is an effect of further reducing the occupation area.

Fifth Embodiment

Figure 6A:
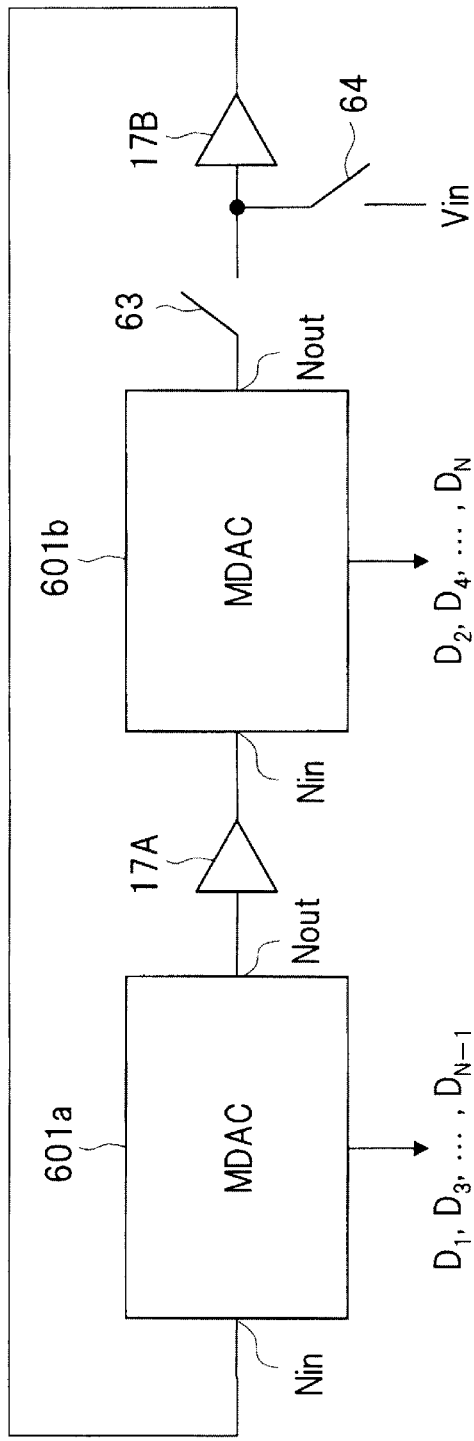
FIGS. 6A and 6B are a block diagram and a timing diagram illustrating a configuration of a cyclic-type analog-to-digital converter according to a fifth embodiment.
Figure 6B:
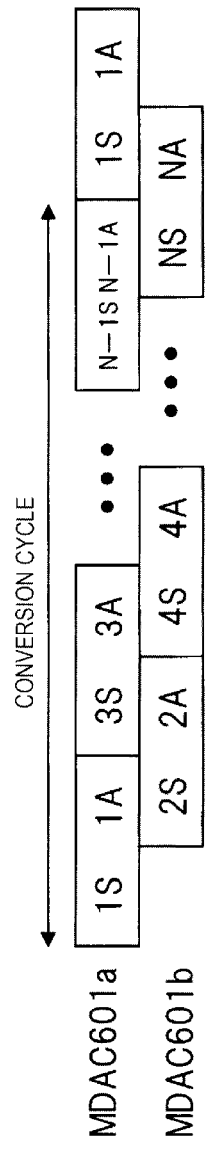

FIG. 6A is a block diagram illustrating a configuration of a cyclic-type analog-to-digital converter 600 according to a fifth embodiment, and FIG. 6B is a timing diagram illustrating operations of the cyclic-type analog-to-digital converter 600. Since the cyclic-type analog-to-digital converter 600 according to the fifth embodiment is similar to the cyclic-type analog-to-digital converter 402 described above in the third embodiment, differences therebetween will be mainly described.

In FIG. 6A, 601a and 601b each represent a multiplying digital-to-analog conversion circuit, and the MDACs described above in the first, second, or fourth embodiment is used. In the drawing, 17A and 17B represent buffer circuits, and each of the buffer circuits 17A and 17B includes buffer circuits 17P and 17N (first or fourth embodiment) or 200P and 200N (second embodiment). In addition, 63 and 64 represent switches, and functionally correspond to the switch 303 described above in the third embodiment.

In this embodiment, the buffer circuit 17B that accompanies the MDAC 601b is used as an input buffer circuit that receives the input signal Vin in the cyclic-type analog-to-digital converter 600. Typically, reversed flow of a signal to a previous circuit, which is called kick-back, occurs in the analog-to-digital converter when the sampling operation is performed. Therefore, the input buffer circuit is provided immediately before the analog-to-digital converter in order to prevent the kick-back.

In this embodiment, the multiplying digital-to-analog conversion circuits described above in the first, second, or fourth embodiment are used as the MDACs 601a and 601b, and the two MDACs 601a and 601b are connected in series via the buffer circuit 17A. Basic operations of the cyclic-type analog-to-digital converter 600 are the same as those described in the third embodiment. When the switch 63 is brought into the ON state, the MDACs 601a and 601b operate such that the residual error amplified signal is fed back via the switch 603 and the buffer circuits 17A and 17B so as to trace a loop. Here, if it is assumed that the MDAC 601a is the first MDAC, an output from a capacitance circuit in the first MDAC 601a is supplied from the output node Nout to the buffer circuit 17A, and an output from a capacitance circuit in the next MDAC 601b is supplied from the output node Nout to the buffer circuit 17B.

In this embodiment, the switch 63 is connected between the buffer circuit 17B that accompanies the next MDAC 601b and the output node Nout of the next MDAC 601b, and the switch 64 is connected between the input signal Vin as an input of the cyclic-type analog-to-digital converter 600 and an input of the buffer circuit 17B. The switch 63 and the switch 64 configure a multiplexer (selection circuit), and the switch 64 is brought into the ON state and the switch 63 is brought into the OFF state when the input signal Vin is taken into the input of the buffer circuit 17B. In contrast, the switch 64 is brought into the OFF state and the switch 63 is brought into the ON state during the analog-to-digital conversion. In doing so, one of the residual error amplification signal from the MDAC 601b and the input signal (analog input voltage) to the cyclic-type analog-to-digital converter 600 is selected by the switches 63 and 64 and is input to the buffer circuit 17B.

That is, the analog input voltage to the analog-to-digital converter 600 is input to the buffer circuit 17B and is then input to the first MDAC 601a via the buffer circuit 17B by bringing the switch 64 into the ON state and bringing the switch 63 in the Off state in the sampling period (1S) during which the input signal Vin is taken in FIG. 6B. In doing so, the buffer circuit 17B can function like an input buffer circuit that is provided before the analog-to-digital converter 600.

This configuration is possible because it is not necessary for the MDAC 601b to perform the residual error amplification in the sampling period (1S). Although the residual error amplification period (NA) for the N-th bit overlaps the sampling period (1S) of the next input signal Vin in the timing drawing in FIG. 6B, it is not necessary to perform the residual error amplification for the last bit (N) in practice (only the rough quantization function is needed). In FIG. 6B, the switch 63 is brought into the ON state and the switch 64 is brought into the OFF state in the periods other than the sampling period (1S). In doing so, the buffer circuit 17B can function as the buffer circuit (corresponding to 17P, 17N, 200P, or 200N) described above in the first, second, or fourth embodiment.

According to the fifth embodiment, it is possible to further reduce the occupation area and the power consumption since the buffer circuit that accompanies the MDAC 601b can be used as the input buffer for preventing kickback, which is separately needed.

Sixth Embodiment

Figure 13:
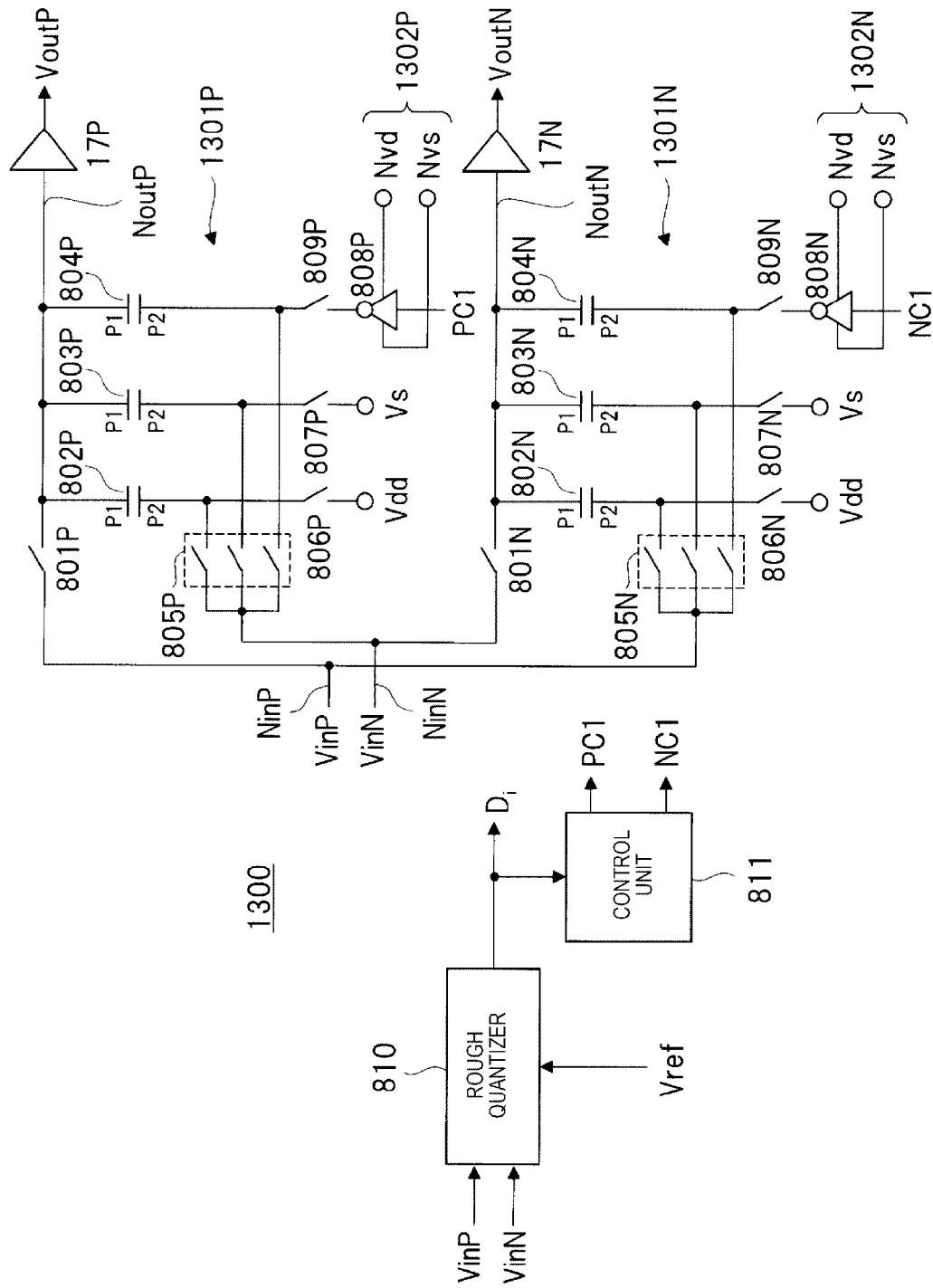
FIG. 13 is a circuit diagram illustrating a configuration of a multiplying digital-to-analog conversion circuit according to a sixth embodiment.

FIG. 13 is a circuit diagram illustrating a configuration of a multiplying digital-to-analog conversion circuit 1300 according to a sixth embodiment. The MDAC 1300 is similar to the MDAC 300 according to the first embodiment. In the following description, reference numerals of corresponding components in the MDAC 300 will be represented in parentheses, and detailed descriptions of the corresponding components will be omitted herein in principle.

In FIG. 13, the multiplying digital-to-analog conversion circuit 1300 includes a rough quantizer 810 (114) that receives the normal phase input signal VinP and the opposite phase input signal VinN and a control unit 811 (115) that receives the digital signal $D_i$ as an output from the rough quantizer 810 and generates the control signals PC1 and NC1 in accordance with the digital signal $D_i$. Furthermore, the MDAC 1300 includes a capacitance circuit 1301P (100P) corresponding to the normal phase input signal, a capacitance circuit 1301N (100N) corresponding to the opposite phase input signal, and voltage supply units 1302P (101P) and 1302N (101N). The buffer circuits 17P (17P) and 17N (17N) that accompany the MDAC 1300 are illustrated in the drawing, an input of the buffer circuit 17P is connected to the output node NoutP (NoutP) of the capacitance circuit 1301P, and an input of the buffer circuit 17N is connected to the output node NoutN (NoutN) of the capacitance circuit 1301N.

The capacitance circuit 1301P includes capacitance elements 802P (12P), 803P (13P), and 804P with the first electrodes P1 connected to the output node NoutP, and the capacitance circuit 1301N includes capacitance elements 802N (12N), 803N (13N), and 804N with the first electrodes P1 connected to the output node NoutN.

In addition, the capacitance circuit 1301P includes a switch 801P (11P) that is connected between the input node NinP (NinP) to which the normal phase input signal VinP is supplied and the output node NoutP (that also corresponds to the output node of the MDAC 1300) and a switch array 805P (16P) that are configured of a plurality of switches provided between the input node NinN and the second electrodes P2 of the capacitance elements 802P to 804P. Furthermore, the capacitance circuit 1301P includes a switch 806P (18P) that is connected between the second electrode P2 of the capacitance element 802P and the power source voltage Vdd, a switch 807P (19P) that is connected between the second electrode P2 of the capacitance element 803P and the ground voltage Vs, and a switch 809P that is connected between the second electrode P2 of the capacitance element 804P and the output node of the voltage supply unit 1302P.

The capacitance circuit 1301N includes a switch 801N (11N) that is connected between the input node NinP to which the opposite phase input signal VinN is supplied and the output node NoutN of the capacitance circuit 1301N and a switch array 805N (16N) that is configured of a plurality of switches provided between the input node NinP and the second electrodes P2 of the capacitance elements 802N to 804N. Furthermore, the capacitance circuit 1301N includes a switch 806N (18N) that is connected between the second electrode P2 of the capacitance element 802N and the power source voltage Vdd, a switch 807N (19N) that is connected between the second electrode P2 of the capacitance element 803N and the ground voltage Vs, and a switch 809N that is connected between the second electrode P2 of the capacitance element 804N and the output node of the voltage supply unit 1302N.

In this embodiment, the voltage supply units 1302P and 1302N include the inverter circuits 808P and 808N, respectively though not particularly limited. The inverter circuit 808P in the voltage supply unit 1302P operates by using, as power source voltages, the power source voltage Vdd supplied to the power source node Nvd and the ground voltage Vs supplied to the power source node Nvs.

The inverter circuit 808P receives the control signal PC1 from the control unit 811 and supplies a signal with an inverted phase to the second electrode P2 of the capacitance element 804P via the switch 809P. That is, the inverter circuit 808P supplies the power source voltage Vdd or the ground voltage Vs corresponding to a signal obtained by inverting a phase of the control signal PC1 to the second electrode P2 of the capacitance element 804P via the switch 809P. Similarly, the inverter circuit 808N in the voltage supply unit 1302N also operates by using, as operation voltages, the power source voltage Vdd and the ground voltage Vs supplied to the voltage nodes Nvd and Nvs, respectively, and supplies the power source voltage Vdd or the ground voltage Vs corresponding to the signal obtained by inverting a phase of the control signal NC1 to the second electrode P2 of the capacitance element 804N via the switch 809N.

In the same manner as in the first embodiment, the MDAC 1300 operates differently in the sampling period and in the residual error amplification period. That is, the MDAC 1300 operates in the sampling period and then operates in the residual error amplification period.

First, the normal phase input signal VinP and the opposite phase input signal VinN are roughly quantized by the rough quantizer 810 in the sampling period. In the quantization, a difference voltage (VinP−VinN) between the normal phase input signal VinP and the opposite phase input signal VinN is obtained. In contrast, a predetermined voltage ranges are determined in the rough quantizer 810 based on the reference voltage Vref. The value of the digital signal $D_i$ is determined depending on which of the predetermined voltage ranges the obtained differential voltage (VinP−VinN) is present in. In this embodiment, the digital signal $D_i$ is a binary digital signal, and is a binary signal "1" or "−1" depending on whether the differential voltage is a positive value or a negative value.

The control unit 811 determines voltages of the control signals PC1 and NC1 in accordance with the value of the digital signal Di. In such a case, the control signals PC1 and NC1 are complementary voltages. That is, when the control signal PC1 is in a high level (binary number "1") corresponding to the power source voltage Vdd, the control signal NC1 corresponds to the ground voltage Vs ("0").

In the sampling period, the switches 801P and 801N and switch arrays 805P and 805N are brought into the ON state, and the switches 806P, 807P, 809P, 806N, 807N, and 809N are brought into the OFF state. In doing so, the normal phase input signal VinP is supplied to the first electrodes P1 of the capacitance elements 802P to 894P in the capacitance circuit 1301P, and the opposite phase input signal VinN is supplied to the second electrodes P2 thereof. As a result, a voltage difference between the normal phase input signal VinP and the opposite phase input signal VinN is applied between the electrodes of each capacitance element in the capacitance circuit 1301P, and each capacitance element is charged. That is, the complete differential sampling is performed. Similarly, the opposite phase input signal VinN is supplied to the first electrodes P1 of the capacitance elements 802N to 894N in the capacitance circuit 1301N, and the normal phase input signal VinP is supplied to the second electrodes P2 thereof. As a result, a voltage difference between the opposite phase input single VinN and the normal phase input signal VinP is applied between the electrodes of each capacitance element in the capacitance circuit 1301N, and each capacitance element is charged. That is, the complete differential sampling is performed.

In the residual error amplification period following the sampling period, the switches 806P, 807P, 809P, 806N, 807N, and 809N are brought into the ON state, and the switches 801P and 801N and the switch arrays 805P and 805N are brought into the OFF state. In doing so, the input nodes NinP and NinN and the output nodes NoutP and NoutN are electrically isolated, and the second electrodes P2 of the capacitance elements 802P and 802N are connected to the power source voltage Vdd via the switches 806P and 806N, and the second electrodes P2 of the capacitance elements 803P and 803N are connected to the ground voltage Vs via the switches 807P and 807N.

In the residual error amplification period, an output from the voltage supply unit 1302P (1302N), that is, an output from the inverter circuit 808P (808N) is applied to the second electrode P2 of the capacitance element 804P (804N) via the switch 809P (809N). That is, the output from the inverter circuit 808P (808N) that is the output form the voltage supply unit 1301P (1301N) is applied to the second electrode P2 of the capacitance element 804P (804N) via the switch 809P (809N). In the same manner as in the first embodiment, voltages in accordance with the output (digital signal Di) from the rough quantizer 810 are applied to the voltage supply units 1301P and 1301N. Specifically, PC1 is set to the power source voltage Vdd and NC1 is set to the ground voltage Vs when $D_i=1$, and PC1 is set to the ground voltage Vs and NC1 is set to the power source voltage Vdd when $D_i=-1$. In doing so, voltages at the output nodes NoutP and NoutN reflect the output from the rough quantizer 810 and become amplified voltage values (residual error amplified values).

Since the complete differential sampling is performed even in this embodiment, it is possible to downsize the capacitance elements in the capacitance circuits 1301P and 1301N and to prevent an increase in the occupation area while maintaining the amount of electric charge with which the capacitance elements are charged. In addition, since the power source voltage Vdd or the ground voltage Vs may be applied to the second electrodes P2 of the capacitance elements 804P and 804N in this embodiment, the voltage supply units 1302P and 1302N do not require a highly precise reference voltage generation circuit, and it is possible to prevent an increase in the occupation area and to reduce the power consumption.

In this embodiment, the output from the MDAC 1300 is delivered via the buffer circuits 17P and 17N in the same manner as in the first embodiment. Here, the output from the MDAC 1300 is a differential voltage Vout (=VoutP−VoutN) between the output voltage VoutP of the buffer circuit 17P and the output voltage VoutN of the buffer circuit 17N and is based on Equation (2).

In the same manner as in the first embodiment, the reference voltage Vref is equivalently set by using a capacity ratio of a plurality of capacitance elements 802P to 804P (802N to 804N) included in the capacitance circuit. In such a case, in the same manner as the above-described embodiments although the reference voltage Vref supplied to the rough quantizer 810 has a voltage value in accordance with the equivalently determined reference voltage Vref, high precision is not required. Although the controller for controlling the aforementioned switches and the like is provided in FIG. 13 in the same manner as in the first embodiment, depiction thereof is omitted in the drawing. In addition, the voltage supply units 1302P and 1302N and the control unit 811 can be collectively considered as a control circuit in the same manner as in the first embodiment.

Seventh Embodiment

Figure 14:
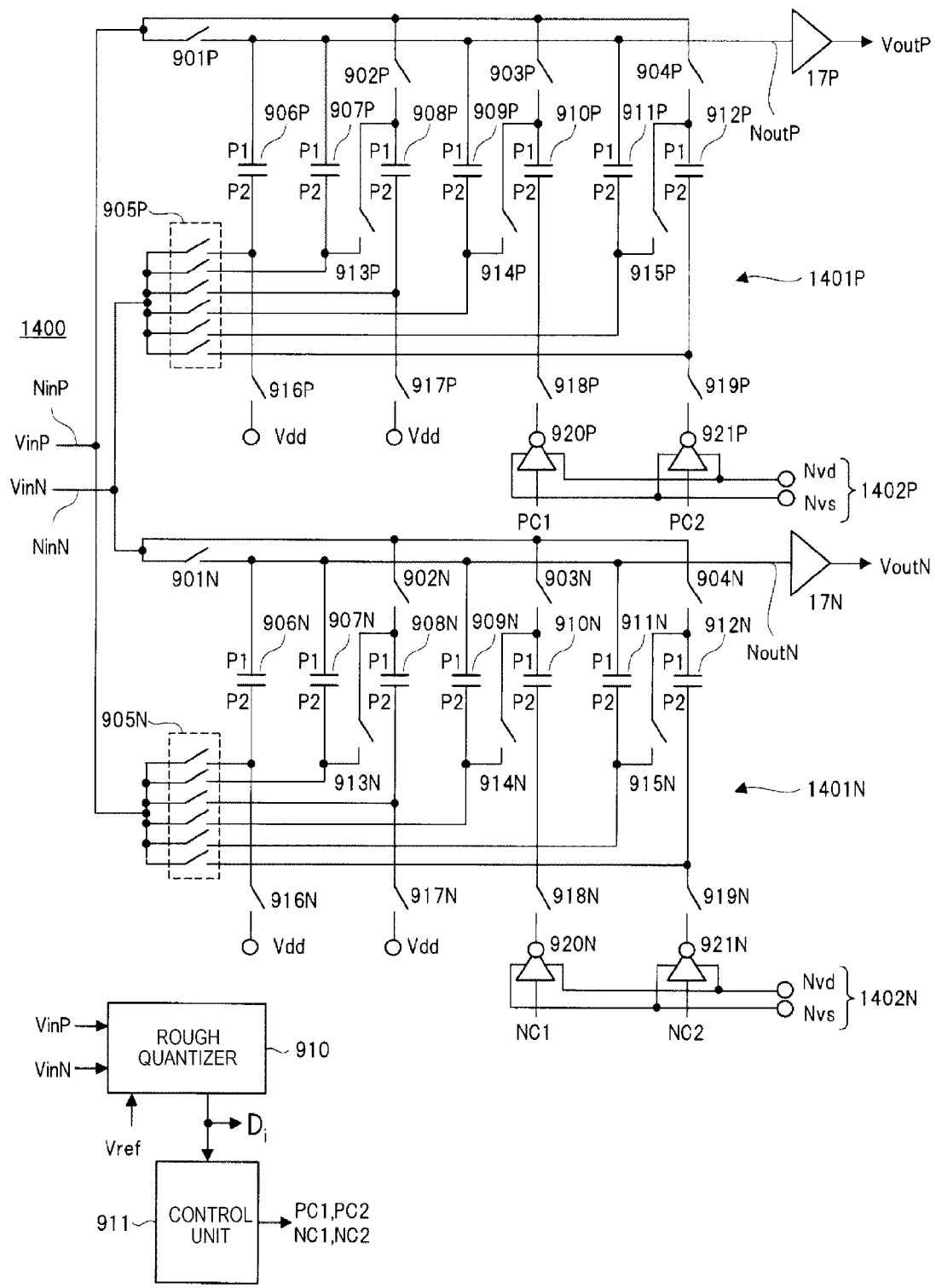
FIG. 14 is a circuit diagram illustrating a configuration of a multiplying digital-to-analog conversion circuit according to a seventh embodiment.

FIG. 14 is a circuit diagram illustrating a configuration of a multiplying digital-to-analog conversion circuit 1400 according to a seventh embodiment. The MDAC 1400 is similar to the MDAC 500 described above in the fourth embodiment. In the following description, reference numerals of corresponding components in the MDAC 500 will be represented in parentheses, and detailed descriptions of the corresponding components will be omitted herein in principle.

The MDAC 1400 includes a rough quantizer 910 (510) that receives the normal phase input signal VinP and the opposite phase input signal VinN and a control unit 911 (511) that generates the control signals PC1, PC2, NC1, and NC2 based on an output from the rough quantizer 910. In addition, the MDAC 1400 includes a capacitance circuit 4101P (501P) corresponding to the normal phase input signal VinP and a capacitance circuit 1401N (502N) corresponding to the opposite phase input signal VinN.

Here, each of the capacitance circuit 1401P and the capacitance circuit 1401N includes the first capacitance bank BK1 and the second capacitance bank BK2 in the same manner as in the fourth embodiment though not expressly illustrated in the drawing. The first capacitance bank BK1 and the second capacitance bank BK2 according to this embodiment respectively include a smaller number of capacitance elements included in each of the capacitance banks unlike the fourth embodiment. That is, the first capacitance bank BK1 included in the capacitance circuit 1401P includes three capacitance elements 907P, 909P, and 911P with first electrodes P1 connected to the output node NoutP, and the second capacitance bank BK2 includes three capacitance elements 908P, 910P, and 912P with first electrodes P1 connected to the input node NinP via the switches 902P to 904, respectively. In addition, the first capacitance bank BK1 included in the capacitance circuit 1401N includes three capacitance elements 907N, 909N, and 911N with first electrodes P1 connected to the output node NoutN, and the second capacitance bank BK2 includes three capacitance elements 908N, 910N, and 912N with first electrodes P1 connected to the input node NinN via the switches 902N to 904N, respectively. Furthermore, the capacitance circuit 1401P includes a capacitance element 906P (51P), and the capacitance circuit 1401N includes a capacitance element 906N (51N). In this embodiment, capacitance values of the capacitance elements 911P, 911N, 912P, and 912N are selected so as to correspond to double the capacitance values of the capacitance elements 909P, 909N, 910P, and 910N.

In the same manner as in the fourth embodiment, the first electrodes P1 of the capacitance elements that are included in the second capacitance bank BK2 in the capacitance circuit 1401P are connected to the second electrodes P2 of the capacitance elements that are included in the first capacitance bank BK1 via corresponding switches 913P to 915P. In addition, the first electrodes P1 of the capacitance elements that are included in the second capacitance bank BK2 in the capacitance circuit 1401N are also connected to the second electrodes P2 of the capacitance elements that are included in the first capacitance bank BK1 via corresponding switches 913N to 915N.

In this embodiment, the voltage supply units 1402P and 1402N include two inverter circuits 920P and 921P and two inverter circuits 920N and 921N, respectively. Each inverter circuit operates by using, as operation voltages, the power source voltages Vdd and Vs supplied to the power source nodes Nvd and Nvs.

In the fourth embodiment described above with reference to FIG. 5, the rough quantizer 510 performs septenary quantization. However, the rough quantizer 910 performs quaternary quantization in this embodiment. That is, the rough quantizer 910 presets voltage ranges for quaternary numbers by using the reference voltage Vref supplied thereto. The rough quantizer 910 outputs a corresponding digital signal $D_i$ depending on which of the four voltage ranges the differential voltage (VinP−VinN) between the normal phase input signal VinP and the opposite phase input signal VinN is present in. If the differential voltage is equal to or greater than Vdd/2, $D_i$=3 is output. If the differential voltage is in a range from Vdd/2 to 0, $D_i$=1 is output. If the differential voltage is in a range from 0 to −Vdd/2, $D_i$=−1 is output. If the differential voltage is equal to or less than −Vdd/2, $D_i$=−3 is output. The control unit 911 outputs the control signals PC1, PC2, NC1, and NC2 in the high level (Vdd) or in the low level (Vs) in the same manner as in the fourth embodiment based on the digital signal $D_i$ as an output from the rough quantizer 910.

In the seventh embodiment, the MDAC 1400 operates differently in the sampling period and in the following residual error amplification period.

First, the switches 901P to 904P and 901N to 904N and the switch arrays 905P and 905N are brought into the ON state in the sampling period. In doing so, the normal phase input signal VinP and the opposite phase input signal VinN are supplied to the respective electrodes of the capacitance elements 907P to 912P and 907N to 912N that are included in the first capacitance bank BK1 and the second capacitance bank BK2 in the capacitance circuit 1401P and the capacitance circuit 1401N via the switches in the ON state. At this time, the normal phase input signal VinP and the opposite phase input signal VinN are supplied to the respective electrodes of the capacitance elements 906P and 906N via the switches in the ON state. In doing so, the respective capacitance elements are charged by the complete differential sampling in the sampling period. In addition, the switches 913P to 919P and 913N to 919N are brought into the OFF state in the sampling period.

In the residual error amplification period following the sampling period, the switches 913P to 919P and 913N to 919N are brought into the ON state, and the switches 901P to 904P and 901N to 904N and the switch arrays 905P and 905N are brought into the OFF state. In doing so, the power source voltage Vdd is supplied to the second electrodes P2 of the capacitance elements 906P and 917P in the capacitance circuit 1401P, and the power source voltage Vdd is supplied to the second electrodes P2 of the capacitance elements 906N and 917N in the capacitance circuit 1401N. In contrast, voltages from the inverter circuits 920P and 921P are applied to the second electrodes P2 of the capacitance elements 910P and 912P that are included in the second capacitance bank BK2 in the capacitance circuit 1401P. Similarly, voltages from the inverter circuits 920N and 921N are applied to the second electrodes P2 of the capacitance elements 910N and 912N that are included in the second capacitance bank BK2 in the capacitance circuit 1401N.

In the residual error amplification period, the first electrodes P1 of the capacitance elements 908P, 910P, and 912P (908N, 910N, and 912N) that are included in the second capacitance bank BK2 are connected to the second electrodes P2 of the corresponding capacitance elements 907P, 909P, and 911P (907N, 909N, and 911N) that are included in the first capacitance bank BK1 via the switches 913P to 915P (913N to 915N) in the same manner as in the fourth embodiment. That is, the capacitance elements in the first capacitance bank BK1 and the capacitance elements in the second capacitance bank BK2 are connected in series. In doing so, voltages at the output nodes NoutP and NoutN are substantially doubled in the same manner as in the fourth embodiment. Since voltages to be applied to the second capacitance bank BK2 is set in accordance with an output from the rough quantizer 910 at this time, the residual error amplification is performed such that the output from the rough quantizer 910 is reflected to the voltages at the output node NoutP and NoutN. For example, when $D_i=3$, both PC1 and PC2 are set to the power source voltage Vdd, and both NC1 and NC2 are set to the ground voltage Vs. When $D_i=1$, PC1 is set to the ground voltage Vs, PC2 is set to the power source voltage Vdd, NC1 is set to the power source voltage Vdd, and NC2 is set to the ground voltage Vs. When $D_i=-1$, PC1 is set to the power source voltage Vdd, PC2 is set to the ground voltage Vs, NC1 is set to the ground voltage Vs, and NC2 is set to the power source voltage Vdd. When $D_i=-3$, both PC1 and PC2 are set to the ground voltage Vs, and both NC1 and NC2 are set to the power source voltage Vdd.

According to the seventh embodiment, the output voltage Vout from the MDAC 1400 is a differential voltage (VoutP−VoutN) between the output voltage VoutP from the buffer circuit 17P and the output voltage VoutN from the buffer circuit 17N and is represented by Equation (7). In addition, the reference voltage Vref can be determined in accordance with a capacity ratio of the plurality of capacitance elements that are included in the capacitance circuit.

In the seventh embodiment, it is possible to suppress an increase in the occupation area and to reduce the power consumption in the same manner as in the fourth embodiment. According to the embodiment in particular, it is possible to reduce the number of capacitance elements, which is effective for reducing the occupation area.

Eighth Embodiment

Figure 7:
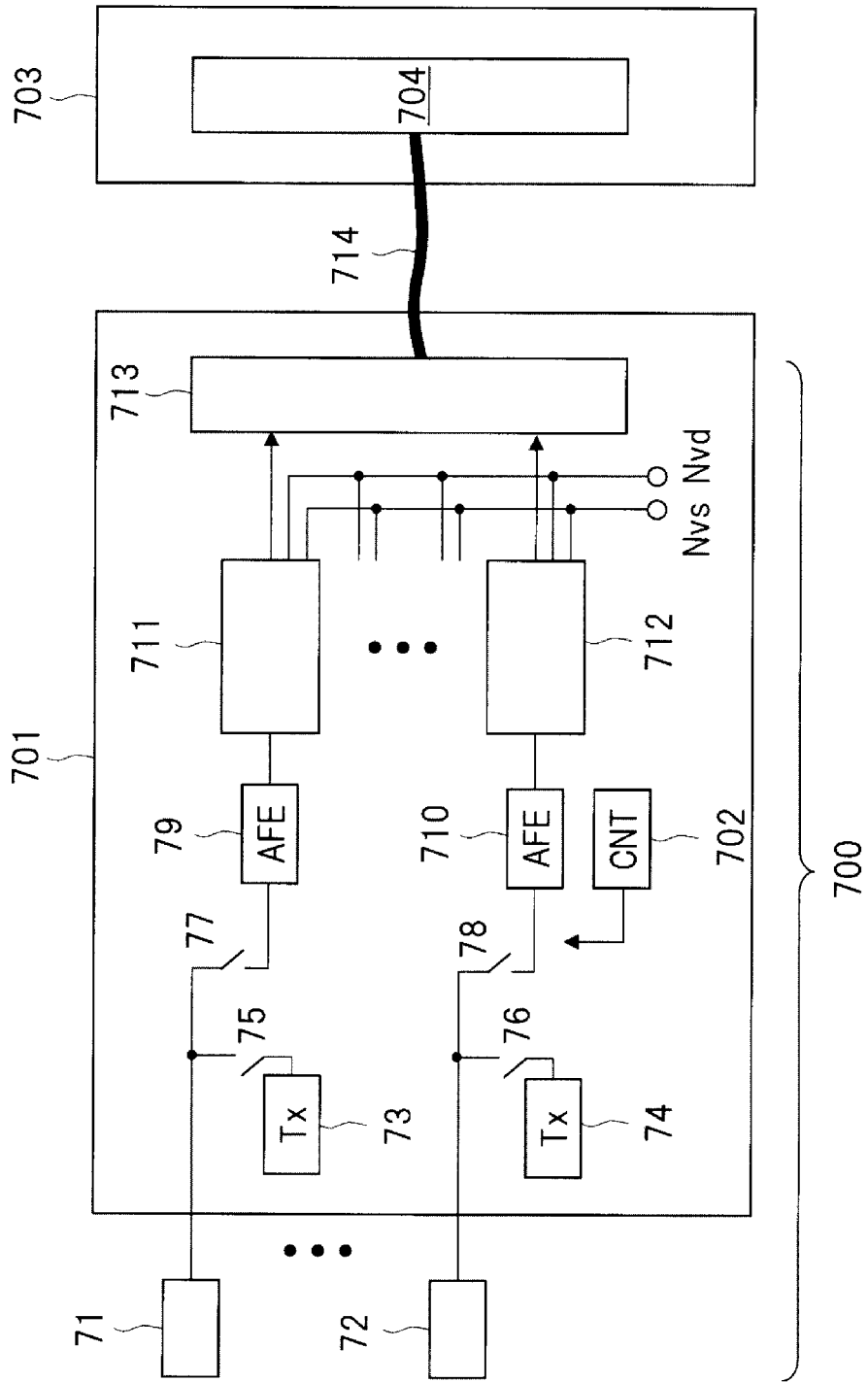
FIG. 7 is a block diagram illustrating a configuration of an ultrasonic diagnosis system according to an eighth embodiment.

FIG. 7 is a block diagram illustrating a medical diagnosis system according to an eighth embodiment. In the drawing, 700 represents a probe for an ultrasonic diagnosis apparatus, and 703 represents an ultrasonic diagnosis apparatus. The probe for an ultrasonic diagnosis apparatus (hereinafter, referred to as a probe for medical diagnosis) 700 includes a plurality of search pieces 71 and 72 and a processing device 701 that supplies a high-voltage pulse to the search pieces 71 and 72 and processes analog signals (measurement target signals) from the search pieces 71 and 72. A result of the processing by the processing device 701 is supplied as a digital signal to an ultrasonic diagnosis apparatus 703 via a digital cable 714. In the ultrasonic diagnosis apparatus 703, a processing unit 704 performs necessary processing on the digital signal that is received via the cable 714.

In a case in which a search piece, a transmission system that supplies a high-voltage pulse to the search piece, and a receiving system that processes an analog signal from the search piece are collectively regarded as one channel, the probe 700 for medical diagnosis according to the embodiment is provided with more than 1000 channels. In the drawing, channels corresponding to two search pieces from among the channels are illustrated as an example. Since each channel has the same configuration, a channel including the search piece 71 will be described as an example.

The processing apparatus 701 includes a transmission unit 73 that is connected to the search piece 71 via a switch 75 and a receiving unit that is connected to the search piece 71 via a switch 77. Here, the receiving unit includes an analog frontend circuit 79 provided with an amplifier or a filter in some cases and an analog-to-digital converter 711, which is connected to the analog frontend circuit 79, to which an analog signal is supplied. The cyclic-type analog-to-digital converter described in the embodiments is used as the analog-to-digital converter 711. That is, a signal from the analog frontend circuit 79 corresponds to the input signal Vin described above.

For diagnosis, the switch 75 is brought into the ON state, and a high-voltage pulse that is generated by the transmission unit 73 is sent to the search piece 71 via the switch 75. The search piece 71 converts the received high-voltage pulse into vibration and sends the vibration as an ultrasonic wave to the inside of a human body as a target of the diagnosis. The sent ultrasonic wave is reflected by organs or the like in the body and is then received again by the search piece 71. The received vibration of the ultrasonic wave is converted into an electrical signal, and the analog frontend circuit 79 performs processing such as amplification on the converted electrical signal and generates the input signal Vin. The input signal Vin as an analog signal is converted into a digital signal by the analog-to-digital converter 711.

The aforementioned processing is performed at each channel (a channel including a search piece 74, switches 76 and 78, an analog frontend circuit 710, and an analog-to-digital converter 712, for example). At each channel, the converted digital signal $D_i$ is supplied to a digital phase adjustment unit (digital circuit) 713. The digital phase adjustment unit 713 obtains body information and reduces the amount of data by performing delay addition processing on an analog-to-digital conversion output from each channel. An output from the digital phase adjustment unit 713 is sent to the ultrasonic diagnosis apparatus 703 via the digital cable 714 and is then used.

In this embodiment, the processing device 701 except for the search pieces 71 and 72 in the probe 700 for medical diagnosis is configured of a single semiconductor device. That is, a plurality of transmission units 73 and 74 corresponding to the plurality of channels, a plurality of analog frontend circuits 79 and 710, a plurality of analog-to-digital converters 711 and 712, switches 73 to 78, and the digital phase adjustment unit 713 are formed in the single semiconductor device. The aforementioned cyclic-type analog-to-digital converter is used as each analog-to-digital converter, and the aforementioned power source nodes Nvd and Nvs are commonly connected in the respective analog-to-digital converters. By commonly using the power source nodes as described above, it is possible to prevent values of voltages to be supplied to the capacitance circuits in the multiplying digital-to-analog conversion circuit from differing from each other in the residual error amplification period and to suppress variations in a conversion gain and the like during the analog-to-digital conversion. In addition, it is possible to reduce variations in the amplification rate G by forming the components on the single semiconductor device and to suppress variations during the conversion from this viewpoint.

According to the aforementioned embodiments, it is possible to suppress an increase in the occupation area, to reduce power consumption, and to thereby integrate 1000 channels or more on a single semiconductor device in terms of the size and heat generation by power consumption. By embedding analog-to-digital converters corresponding to all the channels, it is possible to digitalize the output from the probe for medical diagnosis, to reduce data, and to significantly reduce the weight of the cable necessary for the transmission to the ultrasonic diagnosis apparatus 703 as a result. Furthermore, it is possible to prevent signal quality from being degraded due to the transmission by using an analog cable in the related art, which contributes to high image quality.

In addition, the digital cable 714 may performs wireless transmission from the probe 700 for medical diagnosis to the ultrasonic diagnosis apparatus 703 instead of wired transmission. In such a case, it is easier to handle the probe 700 for medical diagnosis. In FIG. 7, 702 represents a controller for controlling the switches 73 to 77 and the like.

It is possible to understand that the inventions in the following appendix are also described in this application in consideration of the embodiment (seventh embodiment) in which the MDAC converts an analog input signal into a binary digital signal.

APPENDIX

An analog-to-digital converter including:
at least one multiplying digital-to-analog conversion circuit that includes an input node to which an input signal is supplied, an output node which supplies an output signal, and a quantizer which quantizes the input signal based on a reference voltage,
wherein the output signal of the multiplying digital-to-analog conversion circuit is supplied to the input node of the multiplying digital-to-analog conversion circuit or to the input node of the multiplying digital-to-analog conversion circuit via a different multiplying digital-to-analog conversion circuit,
wherein the multiplying digital-to-analog conversion circuit includes a capacitance circuit that samples and amplifies the input signal supplied to the input node and supplies the amplified input signal to the output node, and a control circuit that determines a voltage to be supplied to the capacitance circuit in accordance with an output from the quantizer,
wherein the capacitance circuit includes a plurality of capacitance elements,
wherein among the plurality of capacitance element, a first capacitance element includes a first electrode, which is coupled to the output node, and to which a normal phase signal corresponding to the input signal is supplied, and a second electrode to which an opposite phase signal with an opposite phase to that of the normal phase signal is supplied when the input signal is sampled,
wherein the reference voltage is equivalently set in accordance with a capacity ratio between the capacitance elements that are included in the capacitance circuit, and
wherein when the sampled input signal is amplified, the capacitance circuit supplies the amplified signal, which reflects the output from the quantizer, to the output node by the control circuit determining a voltage to be supplied to the second electrode of the first capacitance element.

Although the above specific descriptions was given of the present invention made by the present inventors based on the embodiments, the present invention is not limited to the embodiments, and various modifications can be made without departing from the gist thereof.

What is claimed is:
1. An analog-to-digital converter comprising:
at least one multiplying digital-to-analog conversion circuit that includes an input node to which an input signal is supplied, an output node which supplies an output signal, and a quantizer which quantizes the input signal based on a reference voltage,
wherein the output signal of the multiplying digital-to-analog conversion circuit is supplied to the input node of the multiplying digital-to-analog conversion circuit or to the input node of the multiplying digital-to-analog conversion circuit via a different multiplying digital-to-analog conversion circuit,
wherein the multiplying digital-to-analog conversion circuit further includes:
a capacitance circuit that samples and amplifies the input signal supplied to the input node and supplies the amplified input signal to the output node, and
a control circuit that determines a voltage to be supplied to the capacitance circuit in accordance with an output from the quantizer,
wherein the capacitance circuit includes:
a first capacitance element that includes a first electrode, which is coupled to the output node, and to which a normal phase signal corresponding to the input signal is supplied, and a second electrode to which an opposite phase signal with an opposite phase to that of the normal phase signal is supplied when the input signal is sampled, and
a second capacitance element that includes a first electrode, which is coupled to the output node, and to which the normal phase signal is supplied, and a second electrode to which the opposite phase signal is supplied when the input signal is sampled,
wherein the reference voltage is equivalently set in accordance with a capacity ratio between the capacitance elements in the capacitance circuit, and
wherein, when the sampled input signal is amplified, the capacitance circuit supplies the amplified signal, which reflects the output from the quantizer, to the output node by the control circuit determining a voltage to be supplied to the second electrodes of the first capacitance element and the second capacitance element.

2. The analog-to-digital converter according to claim 1, further comprising:
a buffer circuit that is coupled between the output node of the multiplying digital-to-analog conversion circuit and the input node of the multiplying digital-to-analog conversion circuit, wherein the capacitance circuit includes a third capacitance element and a fourth capacitance element, each of which includes a first electrode that is coupled to the first electrode of the first capacitance element and a second electrode, wherein when the input signal is sampled, the normal phase signal is supplied to the first electrodes of the third capacitance element and the fourth capacitance element, the opposite phase signal is supplied to the second electrodes of the third capacitance element and the fourth capacitance element, wherein, when the sampled input signal is amplified, mutually different voltages are applied to the second electrodes of the third capacitance element and the fourth capacitance element, and wherein the reference voltage is equivalently set in accordance with a capacity ratio of the first capacitance element, the second capacitance element, the third capacitance element, and the fourth capacitance element.

3. The analog-to-digital converter according to claim 2, wherein the buffer circuit includes a gate that is coupled to the output node, a source, aback gate, and a MOSFET that operates as a source follower circuit such that the back gate is coupled to the source.

4. The analog-to-digital converter according to claim 2, wherein the control circuit includes a first inverter circuit and a second inverter circuit that operate by using a first voltage and a second voltage as power source voltages, respectively, wherein when the sampled input signal is amplified, the first inverter circuit supplies a voltage corresponding to the first voltage or the second voltage to the second electrode of the first capacitance element in accordance with the output from the quantizer, wherein when the sampled input signal is amplified, the second inverter circuit supplies a voltage corresponding to the first voltage or the second voltage to the second electrode of the second capacitance element in accordance with the output from the quantizer, and wherein when the sampled input signal is amplified, a voltage corresponding to the first voltage is supplied to the second electrode of the third capacitance element, and a voltage corresponding to the second voltage is supplied to the second electrode of the fourth capacitance element.

5. The analog-to-digital converter according to claim 1, further comprising:
a first buffer circuit that is coupled between the output node of the multiplying digital-to-analog conversion circuit and an input node of the different multiplying digital-to-analog conversion circuit;
a second buffer circuit that is coupled to the input node of the multiplying digital-to-analog conversion circuit; and
a selection circuit that is coupled between the output node of the different multiplying digital-to-analog conversion circuit and the second buffer circuit,
wherein the output signal from the different multiplying digital-to-analog conversion circuit or an input signal to the analog-to-digital converter is selectively supplied to the second buffer circuit by the selection circuit,
wherein the capacitance circuit includes a third capacitance element and a fourth capacitance element, each of which includes a first electrode that is coupled to the first electrode of the first capacitance element and a second electrode, wherein when the input signal is sampled, the normal phase signal is supplied to the first electrodes of the third capacitance element and the fourth capacitance element, and the opposite phase signal is supplied to the second electrodes of the third capacitance element and the fourth capacitance element, wherein, when the sampled input signal is amplified, mutually different voltages are applied to the second electrodes of the third capacitance element and the fourth capacitance element, and wherein the reference voltage is equivalently set in accordance with a capacity ratio of the first capacitance element, the second capacitance element, the third capacitance element, and the fourth capacitance element.

6. An analog-to-digital converter comprising:
at least one multiplying digital-to-analog conversion circuit that includes an input node to which an input signal is supplied, an output node which supplies an output signal, and a quantizer which quantizes the input signal based on a reference voltage,
wherein the output signal of the multiplying digital-to-analog conversion circuit is supplied to the input node of the multiplying digital-to-analog conversion circuit or to the input node of the multiplying digital-to-analog conversion circuit via a different multiplying digital-to-analog conversion circuit,
wherein the multiplying digital-to-analog conversion circuit further includes:
a capacitance circuit that samples and amplifies the input signal supplied to the input node and supplies the amplified input signal to the output node, and
a control circuit that determines a voltage to be supplied to the capacitance circuit in accordance with an output from the quantizer,
wherein the capacitance circuit includes:
a first capacitance bank including first and second capacitance elements, each of which respectively includes a first electrode and a second electrode, and
a second capacitance bank including third and fourth capacitance elements, each of which respectively includes a first electrode and a second electrode,
wherein, when the input signal is sampled, a normal phase signal corresponding to the input signal is supplied to the first electrodes of the first, second, third, and fourth capacitance elements, and an opposite phase signal with an opposite phase to that of the normal phase signal is supplied to the second electrodes of the first, second, third, and fourth capacitance elements,
wherein, when the input signal is amplified, the first electrodes of the first and second capacitance elements are coupled to the output node, the first electrodes of the third and fourth capacitance elements are coupled to the second electrodes of the first and second capacitance elements, and a voltage from the control circuit is supplied to the second electrodes of the third and fourth capacitance elements,
wherein the reference voltage is equivalently set in accordance with a capacity ratio of the capacitance elements that are included in the capacitance circuit, and
wherein when the input signal is amplified, the capacitance circuit supplies the amplified signal, which reflects the output from the quantizer, to the output node by the control circuit determining voltages to be supplied to the second electrodes of the third capacitance element and the fourth capacitance element.

7. The analog-to-digital converter according to claim 6, further comprising:
- a buffer circuit that is connected between the output node of the multiplying digital-to-analog conversion circuit and the input node of the multiplying digital-to-analog conversion circuit, and receives the amplified signal,
- wherein the capacitance circuit includes a fifth capacitance element which includes a first electrode and a second electrode,
- wherein the first capacitance bank includes a sixth capacitance element which includes a first electrode and a second electrode,
- wherein the second capacitance bank includes a seventh capacitance element which includes a first electrode and a second electrode,
- wherein, when the input signal is sampled, the normal phase signal is supplied to the first electrodes of the fifth, sixth, and seventh capacitance elements, the opposite phase signal is supplied to the second electrodes of the fifth, sixth, and seventh capacitance elements,
- wherein, when the input signal is amplified, the first electrodes of the fifth and sixth capacitance elements are coupled to the output node, the first electrode of the seventh capacitance element is coupled to the second electrode of the sixth capacitance element, and a first voltage is supplied to the second electrodes of the fifth and seventh capacitance elements, and
- wherein the capacitance circuit supplies an amplified signal, which reflects the reference voltage that is equivalently set in accordance with a capacitance ratio of the capacitance elements that are included in the capacitance circuit and the output from the quantizer, to the buffer circuit.

8. The analog-to-digital converter according to claim 7, wherein the buffer circuit includes a gate that is coupled to the output node, a source, a back gate, and a MOSFET that operates as a source follower circuit such that the back gate is coupled to the source.

9. The analog-to-digital converter according to claim 6, further comprising:
- a first buffer circuit that is coupled between the output node of the multiplying digital-to-analog conversion and an input node of the different multiplying digital-to-analog conversion circuit;
- a second buffer circuit that is coupled to the input node of the multiplying digital-to-analog conversion circuit; and
- a selection circuit that is coupled between the different multiplying digital-to-analog conversion circuit and the second buffer circuit,
- wherein an output signal from the different multiplying digital-to-analog conversion circuit or an input signal to the analog-to-digital converter is supplied to the second buffer circuit by the selection circuit.

10. The analog-to-digital converter according to claim 6,
- wherein the control circuit includes a first inverter circuit and a second inverter circuit that operate by using a differential voltage between a first voltage and a second voltage as a power source voltage, respectively,
- wherein, when the sampled input signal is amplified, the first inverter circuit supplies a voltage corresponding to the first voltage or the second voltage to the second electrode of the third capacitance element in accordance with the output from the quantizer,
- wherein, when the sampled input signal is amplified, the second inverter circuit supplies a voltage corresponding to the first voltage or the second voltage to the second electrode of the fourth capacitance element in accordance with the output from the quantizer.

11. A probe for medical diagnosis comprising:
- a plurality of analog-to-digital converters, each of which receives a measurement target signal as an input signal; and
- a digital circuit that receives a digital signal that is converted by the plurality of analog-to-digital converters and outputs a measurement signal based on the digital signal,
- wherein each of the plurality of analog-to-digital converters include:
  - a quantizer that quantizes a corresponding input signal based on a reference voltage,
  - a passive circuit that samples and amplifies the corresponding input signal,
  - a buffer circuit that receives an output from the passive circuit, and
  - a control circuit that forms a voltage to be supplied to the passive circuit in accordance with an output from the quantizer,
- wherein the passive circuit includes:
  - a first capacitance element that includes a first electrode to which a normal phase signal corresponding to the input signal is supplied and a second electrode to which an opposite phase signal with an opposite phase to that of the normal phase signal is supplied when the corresponding input signal is sampled, and
  - a second capacitance element that includes a first electrode to which the normal phase signal corresponding to the input signal is supplied and a second electrode to which the opposite phase signal with an opposite phase to that of the normal phase signal is supplied when the corresponding input signal is sampled,
- wherein the first electrodes of the first capacitance element and the second capacitance element are coupled to the buffer circuit,
- wherein, when the sampled input signal is amplified, a voltage in accordance with the output from the quantizer is supplied from the control circuit to the second electrodes of the first capacitance element and the second capacitance element,
- wherein the reference voltage is equivalently set in accordance with a capacity ratio between the capacitance elements that are included in the passive circuit, and
- wherein the passive circuit supplies an amplified signal, which reflects the output from the quantizer, to the buffer circuit.

12. The probe for medical diagnosis according to claim 11,
- wherein the plurality of analog-to-digital converters are formed on a single semiconductor integrated circuit device, and control circuits of the plurality of analog-to-digital converters are connected to a common voltage.

13. The probe for medical diagnosis according to claim 12,
- wherein the passive circuit further includes:
  - a third capacitance element that includes a first electrode which is coupled to the buffer circuit and a second electrode, and
  - a fourth capacitance element that includes a first electrode that is coupled to the buffer circuit and a second electrode, wherein, when the corresponding input signal is sampled, the normal phase signal is supplied to the first electrodes of the third capacitance element and the fourth capacitance element, and the opposite phase signal is supplied to the second electrodes thereof, and wherein, when the corresponding input signal is amplified, mutually different voltages are supplied to the second electrodes of the third capacitance element and the fourth capacitance element.

14. The probe for medical diagnosis according to claim 12, wherein the passive circuit further includes a fifth capacitance element and a sixth capacitance element, each of which includes a first electrode to which the normal phase signal is supplied and a second electrode to which the opposite phase signal is supplied when the corresponding input signal is sampled, wherein, when the corresponding input signal is amplified, the first electrode of the fifth capacitance element is connected to the second electrode of the first capacitance element, the first electrode of the sixth capacitance element is connected to the second electrode of the second capacitance element, and a voltage from the control circuit is delivered to the first capacitance element and the second capacitance element via the fifth capacitance element and the sixth capacitance element by the voltage from the control circuit being supplied to the second electrodes of the fifth capacitance element and the sixth capacitance element.

15. A medical diagnosis system comprising:
the probe for medical diagnosis according to claim 12; and
a medical diagnosis apparatus that receives, as a radio signal, a measurement signal that is formed by the probe for medical diagnosis.

16. An analog-to-digital converter comprising:
a multiplying digital-to-analog conversion circuit that includes:
an input node to which an input signal is supplied,
an output node which supplies an output signal, and
a quantizer which quantizes the input signal based on a reference voltage,
wherein the multiplying digital-to-analog conversion circuit includes:
a capacitance circuit that samples and amplifies the input signal supplied to the input node and supplies the amplified input signal shifted by a level-shift voltage to the output node, and
a control circuit that determines and generates a voltage to be supplied to the capacitance circuit in accordance with an output from the quantizer,
wherein the capacitance circuit includes:
a first capacitance element that includes a first electrode, which is coupled to the output node, and to which a normal phase signal corresponding to the input signal is supplied, and a second electrode to which an opposite phase signal with an opposite phase to that of the normal phase signal is supplied when the input signal is sampled, and
a second capacitance element that includes a first electrode, which is coupled to the output node, and to which the normal phase signal is supplied, and a second electrode to which the opposite phase signal is supplied when the input signal is sampled, and
a third capacitance element that includes a first electrode, which is coupled to the output node, and to which the normal phase signal is supplied, and a second electrode to which the opposite phase signal is supplied when the input signal is sampled, wherein, when the sampled input signal is amplified, the control circuit generates either a first voltage or a second voltage on the second electrode of the third capacitance element in accordance with the output from the quantizer, and wherein the level-shift voltage is set in accordance with the output from the quantizer, a capacitance ratio between the capacitance elements in the capacitance circuit and a difference between the first voltage and the second voltage.

17. A probe for medical diagnosis comprising:
a plurality of analog-to-digital converters, each of which receives a measurement target signal as an input signal; and
a digital circuit that receives a digital signal that is converted by the plurality of analog-to-digital converters and outputs a measurement signal based on the digital signal,
wherein each of the plurality of analog-to-digital converters includes:
a multiplying digital-to-analog conversion circuit that includes an input node to which an input signal is supplied, an output node which supplies an output signal, and a quantizer which quantizes the input signal based on a reference voltage,
wherein the multiplying digital-to-analog conversion circuit in each of the analog-to-digital converters includes:
a capacitance circuit that samples and amplifies the input signal supplied to the input node and supplies the amplified input signal shifted by a level-shift voltage to the output node, and
a control circuit that determines and generates a voltage to be supplied to the capacitance circuit in accordance with an output from the quantizer,
wherein the capacitance circuit includes:
a first capacitance element that includes a first electrode, which is coupled to the output node, and to which a normal phase signal corresponding to the input signal is supplied, and a second electrode to which an opposite phase signal with an opposite phase to that of the normal phase signal is supplied when the input signal is sampled, and
a second capacitance element that includes a first electrode, which is coupled to the output node, and to which the normal phase signal is supplied, and a second electrode to which the opposite phase signal is supplied when the input signal is sampled, and
a third capacitance element that includes a first electrode, which is coupled to the output node, and to which the normal phase signal is supplied, and a second electrode to which the opposite phase signal is supplied when the input signal is sampled, wherein, when the sampled input signal is amplified, the control circuit generates either a first voltage or a second voltage on the second electrode of the third capacitance element in accordance with the output from the quantizer, and wherein the level-shift voltage is set in accordance with the output from the quantizer, a capacitance ratio between the capacitance elements in the capacitance circuit and a difference between the first voltage and the second voltage.

18. An analog-to-digital converter comprising:
a multiplying digital-to-analog conversion circuit that includes:

an input node to which an input signal is supplied,
an output node which supplies an output signal, and
a quantizer which quantizes the input signal based on a reference voltage,
wherein the multiplying digital-to-analog conversion circuit includes:
a capacitance circuit that samples and amplifies the input signal supplied to the input node and supplies the amplified input signal shifted by a level-shift voltage to the output node, and
a control circuit that determines and generates a voltage to be supplied to the capacitance circuit in accordance with an output from the quantizer, wherein the capacitance circuit includes:
a first capacitance element that includes a first electrode, which is coupled to the output node, and to which a normal phase signal corresponding to the input signal is supplied, and a second electrode to which an opposite phase signal with an opposite phase to that of the normal phase signal is supplied when the input signal is sampled, and
a second capacitance element that includes a first electrode, which is coupled to the output node, and to which the normal phase signal is supplied, and a second electrode to which the opposite phase signal is supplied when the input signal is sampled,
a third capacitance element that includes a first electrode, which is coupled to the output node, and to which the normal phase signal is supplied, and a second electrode to which the opposite phase signal is supplied when the input signal is sampled,
a fourth capacitance element that includes a first electrode, which can be connected to the second electrode of the first capacitance element, and to which the normal phase signal is supplied, and a second electrode to which the opposite phase signal is supplied when the input signal is sampled,
a fifth capacitance element that includes a first electrode, which can be connected to the second electrode of the second capacitance element, and to which the normal phase signal is supplied, and a second electrode to which the opposite phase signal is supplied when the input signal is sampled, and
a sixth capacitance element that includes a first electrode, which can be connected to the second electrode of the third capacitance element, and to which the normal phase signal is supplied, and a second electrode to which the opposite phase signal is supplied when the input signal is sampled,
wherein, when the sampled input signal is amplified, the first electrode of the fourth capacitance element is connected to the second electrode of the first capacitance element,
wherein, when the sampled input signal is amplified, the first electrode of the fifth capacitance element is connected to the second electrode of the second capacitance element,
wherein, when the sampled input signal is amplified, the first electrode of the sixth capacitance element is connected to the second electrode of the third capacitance element,
wherein, when the sampled input signal is amplified, the control circuit generates either a first voltage or a second voltage on the second electrodes of the fifth and the sixth capacitance elements in accordance with the output from the quantizer, and
wherein the level-shift voltage is set in accordance with the output from the quantizer, a capacitance ratio between the capacitance elements in the capacitance circuit and a difference between the first voltage and the second voltage.

* * * * *